US008697180B2

(12) United States Patent
Veerasamy

(10) Patent No.: US 8,697,180 B2
(45) Date of Patent: *Apr. 15, 2014

(54) LARGE-AREA TRANSPARENT CONDUCTIVE COATINGS INCLUDING ALLOYED CARBON NANOTUBES AND NANOWIRE COMPOSITES, AND METHODS OF MAKING THE SAME

(71) Applicant: Guardian Industries Corp., Auburn Hills, MI (US)

(72) Inventor: Vijayen S. Veerasamy, Ann Arbor, MI (US)

(73) Assignee: Guardian Industries Corp., Auburn Hills, MI (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/892,386

(22) Filed: May 13, 2013

(65) Prior Publication Data

US 2013/0260550 A1 Oct. 3, 2013

Related U.S. Application Data

(63) Continuation of application No. 12/659,354, filed on Mar. 4, 2010, now Pat. No. 8,460,747.

(51) Int. Cl.
*H01L 21/288* (2006.01)
(52) U.S. Cl.
USPC .......................................... 427/112; 427/131
(58) Field of Classification Search
USPC .................... 427/112, 122, 249.1
See application file for complete search history.

(56) References Cited

U.S. PATENT DOCUMENTS

| 5,227,038 A | 7/1993 | Smalley et al. |
| 5,300,203 A | 4/1994 | Smalley |
| 5,536,588 A | 7/1996 | Naito |
| 5,556,517 A | 9/1996 | Smalley |
| 5,591,312 A | 1/1997 | Smalley |

(Continued)

FOREIGN PATENT DOCUMENTS

| CA | 2283502 | 9/1998 |
| DE | 10 2007 018 540 | 10/2008 |

(Continued)

OTHER PUBLICATIONS

U.S. Appl. No. 12/659,354, filed Mar. 4, 2010; Veerasamy.

(Continued)

*Primary Examiner* — Michael Cleveland
*Assistant Examiner* — Tabassom Tadayyon Eslami
(74) *Attorney, Agent, or Firm* — Nixon & Vanderhye P.C.

(57) ABSTRACT

Certain example embodiments of this invention relate to large-area transparent conductive coatings (TCCs) including carbon nanotubes (CNTs) and nanowire composites, and methods of making the same. The $\sigma_{dc}/\sigma_{opt}$ ratio of such thin films may be improved via stable chemical doping and/or alloying of CNT-based films. The doping and/or alloying may be implemented in a large area coating system, e.g., on glass and/or other substrates. In certain example embodiments, a CNT film may be deposited and then doped via chemical functionalization and/or alloyed with silver and/or palladium. Both p-type and n-type dopants may be used in different embodiments of this invention. In certain example embodiments, silver and/or other nanowires may be provided, e.g., to further decrease sheet resistance. Certain example embodiments may provide coatings that approach, meet, or exceed 90% visible transmission and 90 ohms/square target metrics.

16 Claims, 12 Drawing Sheets

(56) References Cited

U.S. PATENT DOCUMENTS

| | | | |
|---|---|---|---|
| 5,650,597 A | 7/1997 | Redmayne | |
| 5,739,376 A | 4/1998 | Bingel | |
| 5,852,284 A | 12/1998 | Teder et al. | |
| 6,123,824 A | 9/2000 | Sano et al. | |
| 6,129,901 A | 10/2000 | Moskovits et al. | |
| 6,144,017 A | 11/2000 | Millett et al. | |
| 6,162,926 A | 12/2000 | Murphy et al. | |
| 6,177,918 B1 | 1/2001 | Colgan et al. | |
| 6,183,714 B1 | 2/2001 | Smalley et al. | |
| 6,204,897 B1 | 3/2001 | Colgan et al. | |
| 6,268,594 B1 | 7/2001 | Leutner et al. | |
| 6,288,325 B1 | 9/2001 | Jansen et al. | |
| 6,399,785 B1 | 6/2002 | Murphy et al. | |
| 6,448,412 B1 | 9/2002 | Murphy et al. | |
| 6,538,153 B1 | 3/2003 | Hirsch et al. | |
| 6,602,371 B2 | 8/2003 | Veerasamy | |
| 6,613,603 B1 | 9/2003 | Sano | |
| 6,645,455 B2 | 11/2003 | Margrave et al. | |
| RE38,358 E | 12/2003 | Petrmichl | |
| 6,683,783 B1 | 1/2004 | Smalley et al. | |
| 6,692,717 B1 | 2/2004 | Smalley et al. | |
| 6,749,827 B2 | 6/2004 | Smalley et al. | |
| 6,752,977 B2 | 6/2004 | Smalley et al. | |
| 6,756,025 B2 | 6/2004 | Colbert et al. | |
| 6,756,026 B2 | 6/2004 | Colbert et al. | |
| 6,761,870 B1 | 7/2004 | Smalley et al. | |
| 6,784,361 B2 | 8/2004 | Carlson et al. | |
| 6,790,425 B1 | 9/2004 | Smalley et al. | |
| 6,808,606 B2 | 10/2004 | Thomsen et al. | |
| 6,824,755 B2 | 11/2004 | Colbert et al. | |
| 6,827,918 B2 | 12/2004 | Margrave et al. | |
| 6,835,366 B1 | 12/2004 | Margrave et al. | |
| 6,841,139 B2 | 1/2005 | Liu et al. | |
| 6,852,410 B2 | 2/2005 | Veedu et al. | |
| 6,863,942 B2 | 3/2005 | Ren et al. | |
| 6,875,412 B2 | 4/2005 | Margrave et al. | |
| 6,890,506 B1 | 5/2005 | Harutyunyan et al. | |
| 6,899,945 B2 | 5/2005 | Smalley et al. | |
| 6,900,264 B2 | 5/2005 | Kumar et al. | |
| 6,913,789 B2 | 7/2005 | Smalley et al. | |
| 6,936,233 B2 | 8/2005 | Smalley et al. | |
| 6,936,653 B2 | 8/2005 | McElrath et al. | |
| 6,939,525 B2 | 9/2005 | Colbert et al. | |
| 6,949,237 B2 | 9/2005 | Smalley et al. | |
| 6,969,504 B2 | 11/2005 | Smalley et al. | |
| 6,979,709 B2 | 12/2005 | Smalley et al. | |
| 6,986,876 B2 | 1/2006 | Smalley et al. | |
| 7,008,563 B2 | 3/2006 | Smalley et al. | |
| 7,008,604 B2 | 3/2006 | Smalley et al. | |
| 7,014,737 B2 | 3/2006 | Harutyunyan et al. | |
| 7,029,646 B2 | 4/2006 | Margrave et al. | |
| 7,041,620 B2 | 5/2006 | Smalley et al. | |
| 7,048,903 B2 | 5/2006 | Colbert et al. | |
| 7,048,999 B2 | 5/2006 | Smalley et al. | |
| 7,052,666 B2 | 5/2006 | Colbert et al. | |
| 7,052,668 B2 | 5/2006 | Smalley et al. | |
| 7,061,749 B2 | 6/2006 | Liu et al. | |
| 7,067,098 B2 | 6/2006 | Colbert et al. | |
| 7,070,754 B2 | 7/2006 | Smalley et al. | |
| 7,070,810 B2 | 7/2006 | Hirsch et al. | |
| 7,071,406 B2 | 7/2006 | Smalley et al. | |
| 7,074,310 B2 | 7/2006 | Smalley et al. | |
| 7,087,207 B2 | 8/2006 | Smalley et al. | |
| 7,090,819 B2 | 8/2006 | Smalley et al. | |
| 7,097,820 B2 | 8/2006 | Colbert et al. | |
| 7,105,596 B2 | 9/2006 | Smalley et al. | |
| 7,108,841 B2 | 9/2006 | Smalley et al. | |
| 7,109,581 B2 | 9/2006 | Dangelo et al. | |
| 7,115,864 B2 | 10/2006 | Colbert et al. | |
| 7,125,502 B2 | 10/2006 | Smalley et al. | |
| 7,125,534 B1 | 10/2006 | Smalley et al. | |
| 7,135,160 B2 | 11/2006 | Yang et al. | |
| 7,138,100 B2 | 11/2006 | Smalley et al. | |
| 7,150,864 B1 | 12/2006 | Smalley et al. | |
| 7,163,956 B2 | 1/2007 | Wilson et al. | |
| 7,190,506 B1 | 3/2007 | Berneth et al. | |
| 7,192,642 B2 | 3/2007 | Veedu et al. | |
| 7,195,780 B2 | 3/2007 | Dennis et al. | |
| 7,201,887 B2 | 4/2007 | Smalley et al. | |
| 7,204,970 B2 | 4/2007 | Smalley et al. | |
| 7,205,069 B2 | 4/2007 | Smalley et al. | |
| 7,211,795 B2 | 5/2007 | Collier et al. | |
| 7,215,331 B2 | 5/2007 | Song et al. | |
| 7,220,818 B2 | 5/2007 | Stoddart et al. | |
| 7,246,470 B2 | 7/2007 | Beyrle | |
| 7,250,148 B2 | 7/2007 | Yang et al. | |
| 7,264,876 B2 | 9/2007 | Smalley et al. | |
| 7,265,174 B2 | 9/2007 | Carroll et al. | |
| 7,273,095 B2 | 9/2007 | Li et al. | |
| 7,279,916 B2 | 10/2007 | Suhir | |
| 7,338,648 B2 | 3/2008 | Harutyunyan et al. | |
| 7,338,915 B1 | 3/2008 | Smalley et al. | |
| 7,354,563 B2 | 4/2008 | Smalley et al. | |
| 7,357,906 B2 | 4/2008 | Colbert et al. | |
| 7,372,510 B2 | 5/2008 | Abileah | |
| 7,375,871 B2 | 5/2008 | Libretto et al. | |
| 7,390,477 B2 | 6/2008 | Smalley et al. | |
| 7,390,767 B2 | 6/2008 | Smalley et al. | |
| 7,411,716 B2 | 8/2008 | Oh et al. | |
| 7,436,393 B2 | 10/2008 | Hong et al. | |
| 7,450,294 B2 | 11/2008 | Weidner | |
| 7,504,957 B2 | 3/2009 | Veerasamy et al. | |
| 7,511,872 B2 | 3/2009 | Tonar et al. | |
| 7,525,714 B2 | 4/2009 | Poll et al. | |
| 7,545,551 B2 | 6/2009 | Yoshimura et al. | |
| 7,547,658 B2 | 6/2009 | Liu et al. | |
| 7,601,436 B2 | 10/2009 | Djurovich et al. | |
| 7,629,741 B2 | 12/2009 | Liao et al. | |
| 7,659,661 B2 | 2/2010 | Park | |
| 7,662,663 B2 | 2/2010 | Cok et al. | |
| 7,663,311 B2 | 2/2010 | Im et al. | |
| 7,663,312 B2 | 2/2010 | Anandan | |
| 8,460,747 B2 * | 6/2013 | Veerasamy | 427/122 |
| 2004/0069430 A1 | 4/2004 | Bubik et al. | |
| 2004/0197546 A1 | 10/2004 | Rinzler et al. | |
| 2006/0039848 A1 * | 2/2006 | Matarredona et al. | 423/447.1 |
| 2006/0059861 A1 | 3/2006 | Grassmuck et al. | |
| 2006/0135030 A1 * | 6/2006 | Mao | 445/50 |
| 2008/0088219 A1 | 4/2008 | Yoon et al. | |
| 2008/0169021 A1 | 7/2008 | Krasnov | |
| 2008/0199702 A1 | 8/2008 | Murphy et al. | |
| 2008/0280078 A1 | 11/2008 | Krisko et al. | |
| 2008/0308147 A1 | 12/2008 | Lu et al. | |
| 2009/0020157 A1 | 1/2009 | Krasnov et al. | |
| 2009/0032098 A1 | 2/2009 | Lu | |
| 2009/0035555 A1 | 2/2009 | Brahim et al. | |
| 2009/0165857 A1 | 7/2009 | Naito et al. | |

FOREIGN PATENT DOCUMENTS

| | | |
|---|---|---|
| EP | 0854839 | 7/1998 |
| EP | 1015384 | 7/2000 |
| EP | 1115655 | 7/2001 |
| EP | 1404908 | 4/2004 |
| EP | 1623437 | 2/2006 |
| JP | 2001-520615 | 10/2001 |
| JP | 2005-520021 | 7/2005 |
| KR | 1020010080933 | 8/2001 |
| WO | WO 97/09272 | 3/1997 |
| WO | WO 98/39250 | 9/1998 |
| WO | WO 00/17102 | 3/2000 |
| WO | WO 03/004741 | 1/2003 |
| WO | WO 03/078317 | 9/2003 |
| WO | WO 2004/097853 | 11/2004 |
| WO | WO 2008/085541 | 7/2008 |
| WO | WO 2008/105804 | 9/2008 |
| WO | WO 2009/049375 | 4/2009 |

OTHER PUBLICATIONS

International Search Report dated Jul. 19, 2011.
"A Method of Printing Carbon Nanotube Thin Films", Zhou et al., 2006 American Institute of Physics.

(56) References Cited

OTHER PUBLICATIONS

"Carbon Nanotube Films for Transparent and Plastic Electronics", Gruner, Journal of Materials Chemistry (2006), pp. 3533-3539.

"Applications of Carbon Nanotubes in the Twenty-First Century", Endo et al., The Royal Society (2004), pp. 2223-2238.

"How do Carbon Nanotubes Fit into the Semiconductor Roadmap", Graham et al., Applied Physics A (2005), pp. 1141-1151.

Manuscript "Detection of Rain Using Capacitive Field Imaging", Veerasamy, Guardian Industries Corp., pp. 1-18.

"Transparent and Flexible Carbon Nanotube/Polyaniline pH Sensors", Kaempgen et al., Journal of Electroanalytical Chemistry 586 (2006), pp. 72-76.

"High-Conductivity Polymer Nanocomposites Obtained by Tailoring the Characteristics of Carbon Nanotube Fillers", Grossiord et al., Advanced Functional Materials (2008), pp. 3226-3234.

Veerasamy et al., "Nitrogen Doping of Highly Tetrahedral Amorphous Carbon," Physical Review B, vol. 48, No. 24, Dec. 1993, pp. 17 954-17 959.

Veerasamy et al., "N-Type Doping of Highly Tetrahedral Diamond-Like Amorphous Carbon," Journal of Physical Condensation Matter, No. 5, 1993, pp. L169-L174.

Veerasamy et al., "Properties of n-Type Tetrahedral Amorphous Carbon (ta-C)/p-Type Crystalline Silicon Heterojunction Diodes," IEEE Transaction on Electron Devices, vol. 42, No. 4, Apr. 1995, pp. 577-585.

Xuesong, et al., "Transfer of Large-Area Graphene Films for High Performance Transparent Conductive Electrodes," American Chemical Society, Nano Letters, vol. xx, No. x, 2009, pp. A-E.

Rondelez et al., "Two Dimensional Films of Discotic Molecules at an Air-Water Interface," J. Physique 43 (1982) pp. 1371-1377.

Rondelez et al., "Liquid Expanded-Liquid Condensed Phase Transition in Langmuir Films of Discotic Molecules," J. Physique 48 (1987) pp. 1225-1234.

J. Billard et al., "Miscibility Studies of Disc-Like Molecules," Pramana 13 (1979) pp. 309-318.

Science Daily, Science News, "Highly Absorbing, Flexible Solar Cells with Silicon Wire Arrays Created," http://www.sciencedaily.com/releases/2010/02/1002161402593htm.

E. Clar, "The Aromatic Sextet," John Wiley and Sons Ltd., 1972.

Novoselov, K.S., "Electrical Field Effect in Atomically Thin Carbon Films," Science, vol. 306, (2004), pp. 666-669.

U.S. Appl. No. 12/285,374, Krasnov et al., filed Nov. 18, 2008.
U.S. Appl. No. 12/285,890, Thomsen et al., filed Oct. 15, 2008.
U.S. Appl. No. 12/457,006, Broadway et al., filed May 28, 2009.
U.S. Appl. No. 11/049,292, Thomsen et al., filed Feb. 3, 2005.
U.S. Appl. No. 11/122,218, Thomsen et al., filed May 5, 2005.
U.S. Appl. No. 12/292,406, Krasnov, filed Nov. 18, 2008.
U.S. Appl. No. 12/453,755, Veerasamy, filed May 21, 2008.
U.S. Appl. No. 12/149,640, Veerasamy et al., filed May 6, 2008.
U.S. Appl. No. 12/458,790, Thomsen et al., filed Jul. 22, 2009.
U.S. Appl. No. 12/318,912, Veerasamy, filed Jan. 12, 2009.
U.S. Appl. No. 61/237,580, Veerasamy, filed Aug. 27, 2009.

\* cited by examiner

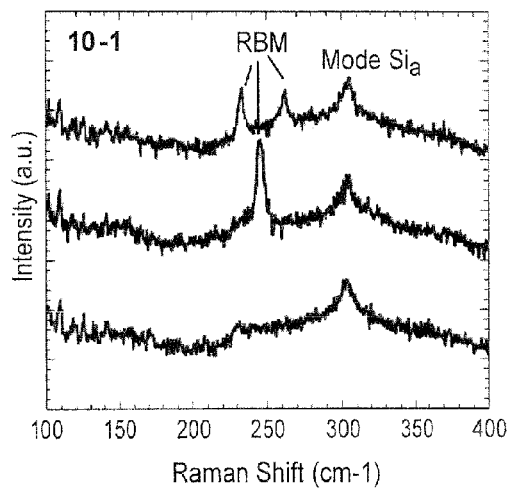 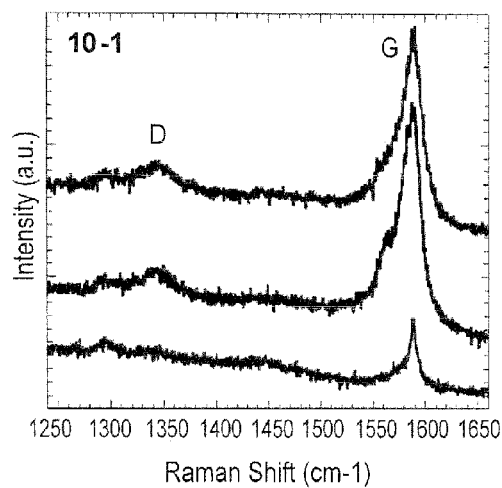
Fig. 1a
Fig. 1b
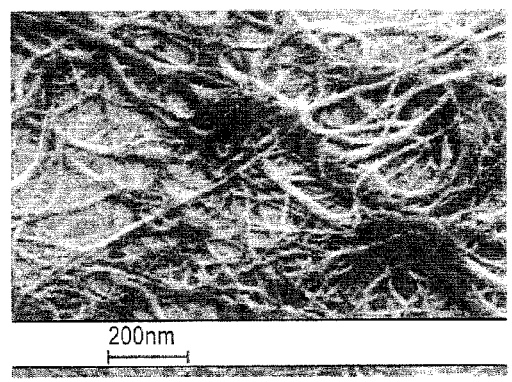 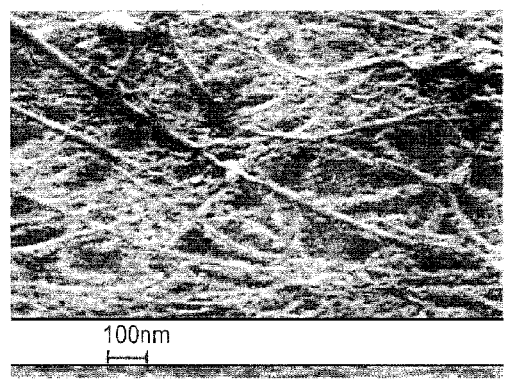
Fig. 2a
Fig. 2b

| SN | CNT Ink Rod | CNT Ink Speed | Top Coat Rod | Top Coat Speed | PdCl2 Conc. | PdCl2 Exposure | Ag Conc. | Ag Exposure | Pre Optics Y 2IC | Pre SR AVG | Post Optics Y 2IC | Post SR AVG | Δ%T | ΔSR | Set ΔSR AVG | Set Δ%T AVG |
|---|---|---|---|---|---|---|---|---|---|---|---|---|---|---|---|---|
| Control 1 | n/a | n/a | n/a | n/a | 1/20 | 30s | n/a | n/a | 91.48 | n/a | 91.47 | n/a | -0.01 | | | |
| Conrtrol 2 | | | | | 1/20 | 30s | 0.01g | 15s | 91.41 | n/a | 91.6 | n/a | 0.19 | | | |
| 1 | 5 | 3 | 5 | 3 | 1/20 | 30s | n/a | n/a | 88.84 | 621.5 | 89.03 | 488.75 | 0.19 | -132.75 | | |
| 2 | 5 | 3 | 5 | 3 | 1/20 | 30s | n/a | n/a | 87.59 | 667 | 87.21 | 620.5 | -0.38 | -46.5 | | |
| 3 | 5 | 3 | 5 | 3 | 1/50 | 30s | n/a | n/a | 87.36 | 642.5 | 87.72 | 570.5 | 0.36 | -72 | | |
| 4 | 5 | 3 | 5 | 3 | 1/50 | 10s | n/a | n/a | 89.64 | 479 | 89.29 | 398 | -0.35 | -81 | -83.0625 | -0.045 |
| 5 | 5 | 3 | 5 | 3 | 1/20 | 30s | 0.01g | 15s | 87.54 | 611 | 85.77 | n/a | -1.77 | | | |
| 6 | 5 | 3 | 5 | 3 | 1/20 | 10s | 0.005g | 15s | 89.2 | 593.25 | 80.88 | n/a | -8.32 | | | |
| 7 | 5 | 3 | 5 | 3 | 1/50 | 30s | 0.01g | 15s | 87.49 | 693 | 87.59 | n/a | 0.1 | | | |
| 8 | 5 | 3 | 5 | 3 | 1/50 | 10s | 0.005g | 15s | 87.57 | 653.5 | 86.96 | n/a | -0.61 | | | -2.65 |
| 9 | 10 | 3 | 10 | 3 | 1/20 | 30s | n/a | n/a | 88.59 | 499.25 | 86.87 | 582 | -1.72 | 82.75 | | |
| 10 | 10 | 3 | 10 | 3 | 1/20 | 10s | n/a | n/a | 88.13 | 494.25 | 84.57 | 563.5 | -3.56 | 69.25 | | |
| 11 | 10 | 3 | 10 | 3 | 1/50 | 30s | n/a | n/a | 81.28 | 560.5 | 80.67 | 452.25 | -0.61 | -108.25 | | |
| 12 | 10 | 3 | 10 | 3 | 1/50 | 10s | n/a | n/a | 80.95 | 721.25 | 81.27 | 411.75 | 0.32 | -309.5 | -66.4375 | -1.3925 |
| 13 | 10 | 3 | 10 | 3 | 1/20 | 30s | 0.01g | 10s | 78.9 | 587.75 | 79.18 | 439.25 | 0.28 | -148.5 | | |
| 14 | 10 | 3 | 10 | 3 | 1/20 | 10s | 0.005g | 10s | 80.36 | 569.5 | 79.92 | 465.5 | -0.44 | -104 | | |
| 15 | 10 | 3 | 10 | 3 | 1/50 | 30s | 0.01g | 10s | 80.41 | 597.5 | 79.24 | 405.25 | -1.17 | -192.25 | | |
| 16 | 10 | 3 | 10 | 3 | 1/50 | 10s | 0.005g | 10s | 78.73 | 591 | 78.15 | 458.5 | -0.58 | -132.5 | -144.3125 | -0.4775 |

Fig. 7

LARGE-AREA TRANSPARENT CONDUCTIVE COATINGS INCLUDING ALLOYED CARBON NANOTUBES AND NANOWIRE COMPOSITES, AND METHODS OF MAKING THE SAME

This application is a continuation of application Ser. No. 12/659,354, filed Mar. 4, 2010, the entire disclosure of which is hereby incorporated herein by reference in this application.

FIELD OF THE INVENTION

Certain example embodiments of this invention relate to large-area transparent conductive coatings (TCCs) including carbon nanotubes (CNTs) and nanowire composites, and methods of making the same. More particularly, certain example embodiments of this invention relate to techniques for improving the $\sigma_{dc}/\sigma_{opt}$ ratio via stable chemical doping and/or alloying of CNT-based films that may be implemented across large areas on glass and/or other substrates. In certain example embodiments, a CNT film may be deposited and then doped via chemical functionalization and/or alloyed with silver and/or palladium. Both p-type and n-type dopants may be used in different embodiments of this invention. In certain example embodiments, silver and/or other nanowires may be provided, e.g., to further decrease sheet resistance.

BACKGROUND AND SUMMARY OF EXAMPLE EMBODIMENTS OF THE INVENTION

Carbon nanotubes (CNT) are promising materials for transparent conduction as a result of their exceptional electrical, optical, mechanical, and chemical properties. Ultra thin films based on CNT networks above the percolation limit have beneficial attributes such as stiffness and chemical stability that makes it superior to indium tin oxide (ITO) in certain applications. CNT nano-mesh films exhibit flexibility, allowing films to be deposited on pliable substrates prone to acute angles, bending, and deformation, without fracturing the coating. Modeling work has shown that CNT films may offer potential advantages such as, for example, tunable electronic properties through chemical treatment and enhanced carrier injection owing to the large surface area and field-enhanced effect at the nanotube tips and surfaces. It is also recognized that although ITO is an n-type conductor, such CNT films can be doped p-type and, as such, can have applications in, for instance, the anode or injecting hole into OLED devices, provided the films are smooth to within 1.5 nm RMS roughness.

Although ITO films still lead CNT films in terms of sheet conductance and transparency, the above-mentioned advantages together with potential cost reductions have stimulated significant interest in exploiting carbon nanotube films as transparent conductive alternative to ITO. In order to live up to its expectations, CNT films should display high transparency coupled with low sheet resistance. The relationship between transparency and sheet resistance for thin conducting films is controlled by the ratio of dc conductivity and optical conductivity, $\sigma_{dc}/\sigma_{opt}$, such that high values of this ratio typically are most desirable.

However, to date, viable CNT synthetic methods yield poly-dispersed mixtures of tubes of various chiralities, of which roughly one-third are metallic with the remainder being semiconducting. The low $\sigma_{dc}/\sigma_{opt}$ performance metric of such films is largely related to the large fraction of semi-conducting species. These semiconducting tubes, in turn, also give rise to the bundling of the tubes, which tends to increase the junction resistance of the film network.

The typical value of $\sigma_{opt}$ for CNT films depends on the density of the film. Just above the percolation limit, this value tends to close at $1.7 \times 10^4$ S/m at 550 nm, while the dc electrical conductivity to date is in the region of $5 \times 10^5$ S/m. However, industry specifications require better than 90% transmission and less than 90 ohms/square sheet resistance. To achieve these values, one can determine that the necessary dc conductivity be in excess of $7 \times 10^5$ S/m. Thus, it will be appreciated that there is a need in the art for improving the electronic quality of even the best CNT films so that the $\sigma_{dc}/\sigma_{opt}$ ratio, in turn, is improved. This poly-dispersity stems from the unique structure of SWNTs, which also renders their properties highly sensitive to the nanotube diameter.

Certain example embodiments of this invention relate to the deposition of nano-mesh CNT films on glass substrates and, in particular, the development of coatings with high $\sigma_{dc}/\sigma_{opt}$ on thin, low iron or iron free soda lime glass and/or other substrates (e.g., other glass substrates such as other soda lime glass and borosilicate glass, plastics, polymers, silicon wafers, etc.). In addition, certain example embodiments of this invention relate to (1) finding viable avenues of how to improve the $\sigma_{dc}/\sigma_{opt}$ a metric via stable chemical doping and/or alloying of CNT based films, and (2) developing a large area coating technique suitable for glass, as most work date has focused on flexible plastic substrates. Certain example embodiments also pertain to a model that relates the morphological properties of the film to the $\sigma_{dc}/\sigma_{opt}$.

In certain example embodiments of this invention, a method of making a coated article comprising a substrate supporting a carbon nanotube (CNT) inclusive thin film is provided. A CNT-inclusive ink is provided. The ink is applied to the substrate to form an intermediate coating. A material is provided over the intermediate coating to improve adhesion to the substrate. A solution of $PdCl_2$ is prepared. The intermediate coating is exposed to the solution of $PdCl_2$ so that the Pd nucleates at junctions within the intermediate coating, thereby reducing porosity in the intermediate coating in forming the CNT-inclusive thin film. An overcoat or passivation layer is provided over the intermediate coating following the exposing.

In certain example embodiments of this invention, a method of making a coated article comprising a substrate supporting a carbon nanotube (CNT) inclusive thin film is provided. A CNT-inclusive ink is provided, with the CNT-inclusive ink comprising double-wall nanotubes. The ink is applied to the substrate to form an intermediate coating using a slot die apparatus. The intermediate coating is dried or allowed to dry. An adhesion-promoting layer is provided over the intermediate coating to improve adhesion to the substrate. The intermediate coating is doped with a salt and/or super acid so as to chemically functionalize the intermediate coating. A solution of $PdCl_2$ is provided. The intermediate coating is exposed to the solution of $PdCl_2$ so that the Pd nucleates at junctions within the intermediate coating, thereby reducing porosity in the intermediate coating in forming the CNT-inclusive thin film. An overcoat or passivation layer is applied over the intermediate coating following the exposing.

In certain example embodiments of this invention, a method of making a coated article comprising a substrate supporting a carbon nanotube (CNT) inclusive thin film is provided. A CNT-inclusive ink is provided, with the CNT-inclusive ink comprising double-wall nanotubes. The ink is applied to the substrate to form an intermediate coating using a slot die apparatus. The intermediate coating is dried or allowed to dry. An adhesion-promoting layer is provided over the intermediate coating to improve adhesion to the substrate. A solution of $PdCl_2$ is provided. The intermediate coating is exposed to the solution of $PdCl_2$ so that the Pd nucleates at junctions within the intermediate coating, thereby reducing porosity in the intermediate coating in forming the CNT-inclusive thin film. A silvering solution is provided. The intermediate coating is exposed to the silvering solution to short junctions in the intermediate coating in forming the CNT inclusive thin film. An overcoat or passivation layer is applied over the intermediate coating following the exposing.

The features, aspects, advantages, and example embodiments described herein may be combined to realize yet further embodiments.

BRIEF DESCRIPTION OF THE DRAWINGS

These and other features and advantages may be better and more completely understood by reference to the following detailed description of exemplary illustrative embodiments in conjunction with the drawings, of which:

FIG. 1a shows the raw Raman spectrum of a typical pristine undoped film;

FIG. 1b shows the G and D peaks, and the ratio of their intensities is associated with the level of perfection of the graphitic lattice;

FIG. 2a is a scanning electron micrograph (SEM) picture of a typical CNT film on glass;

FIG. 2b is a scanning electron micrograph (SEM) picture of a composite PEDOT/PSS embedded into the CNT as the network is approximately one-quarter full, in accordance with an example embodiment;

FIG. 7 is a chart demonstrating pre- and post-alloying visible transmission and sheet resistances for a variety of samples produced in accordance with an example embodiment;

DETAILED DESCRIPTION OF EXAMPLE EMBODIMENTS OF THE INVENTION

Figure 3A:
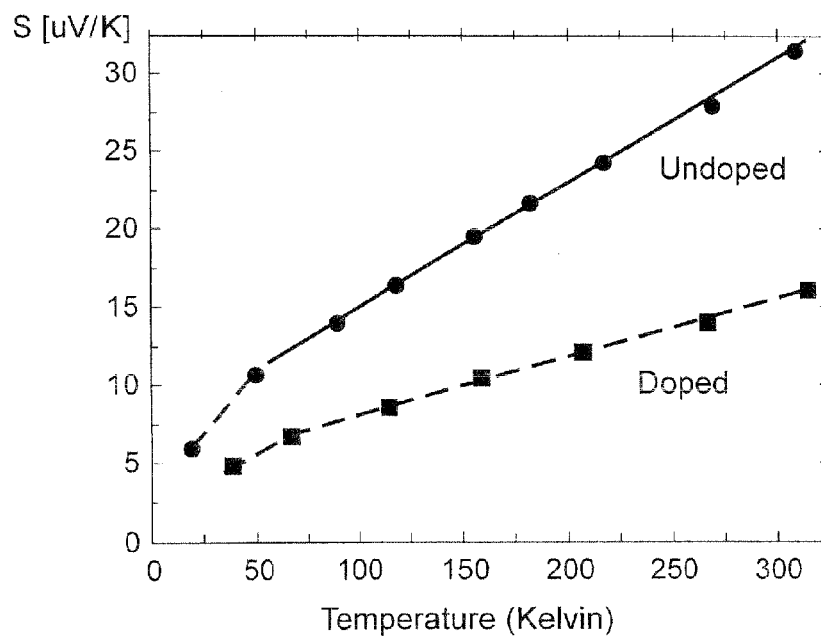
FIG. 3a shows the temperature dependence of the thermoelectric power measured for both as-deposited and $H_2SO_4$ chemically modified samples produced in accordance with an example embodiment.

While thin films made from random meshed networks of carbon nanotubes have been successfully deposited on various transparent substrates, further improvements are necessary before they can be used in photovoltaic devices and other electronic applications such as, for example, OLEDs. Certain example embodiments, however, relate to solution-deposited smooth thin films made from chemically altered double wall nanotubes and composites that have stable sheet resistances below 100 ohms/square at visible transmittance levels of above 83.5%. As described in detail below, the effect of modifying the carbon nanotubes can be verified using thermopower vs. temperature measurements, and changes in optoelectronics properties of the altered films related to weathering may be studied via using SEM, XPS, IR/Raman and spectral transmittance measurements. Certain example embodiments also relate to applications of doped films on glass, namely, capacitive touch sensor electrodes and functional coatings in a fast defogging device. In both cases, these films have the potential of being viable alternatives to conventional transparent conductive oxides.

Grown carbon nanotubes' hydrophobic nature coupled with tendency to clump in solution has presented many fabrication challenges that limit the workability of the material. To date, researchers have utilized the method of vacuum filtrating aqueous solutions of carbon nanotubes to form thin carbon nanotube mats on filtration paper, commonly termed bucky-paper. However, the highly porous material is brittle and fragile due to the relatively weak van der Waals forces between tubes. In order to fully harness the mechanical properties offered by carbon nanotubes, uniform and dense distribution of nanotube connectivity throughout the film is desirable. In response to this limitation, certain example embodiments involve derivatizing of the CNT into a workable water-based ink compatible to glass and using a vertical slot coating technology that is both scalable and capable of achieving the electro-optical film quality at a high throughput.

High quality CNT tubes with length distribution from 5-10 microns were prepared using the catalytic CVD technique. This process produces a mixture of nanotubes, including some individual SWNTs and mostly DWNTs of individual average diameter about 1.4 nm. These nanotubes are chemically robust and can be produced in large volumes. The resulting purified CNTs are then solubilized and dispersed with the help of surfactants into water at low power sonication to form a precursor ink. Coating aids were used for tuning the ink rheology and coating capability onto glass substrates. Such coating aids may include, for example, BTAC, DMF, NPH, and/or the like. This ink may also be coated onto a variety of rigid or flexible substrates (e.g., glass, plastic, metal, silicon, etc.). CNT thin films on thin soda-lime glass substrates were deposited using a vertical slot method, which provides many benefits including, for example, higher line speed capability and greater uniformity over large areas than spray techniques. The pre-metered vertical slot heads have been designed to exacting tolerances based on the rheological characteristics of the ink fluid. The fluid rheology design parameter encodes the ratio of viscosity verses shear rate at a specific temperature and is used to design the internal flow geometry. The body sections may be disassembled and split apart for cleaning. A slot helps to maintain the fluid at the proper temperature for application, distribute it uniformly to the desired coating width, and apply it to the glass substrates. Direct setting of the flow rate helps determine the wet thickness of the coated film. These techniques involve a precision liquid delivery system and a slot head for widthwise distribution. Substantially uniform coatings are produced on glass without ribbing and extremely low defect counts. These techniques may include, for example, an apparatus available from Tokyo Electron and/or Shafley techniques.

The slot coating lends itself well to applying multilayer coatings. The CNT film wet thickness is in the range of several tens of microns and is rapidly dried at 70-90 degrees C. so as to produce final CNT film thicknesses in the range of 5-100 nm. CNT films on glass substrates were subsequently subjected to a 10 minute 9 M $H_2SO_4$ acid soak or a gas based sulphonation process, which reduces the conductivity of the film substantially. In order to enhance the adhesion between nanotube thin films and glass substrate as well as stabilize the doped films, a 3-5 nm thick PVP polymer overcoat is applied using a similar slot process so as to encapsulate CNT films. The sulphuric acid treatment surface functionalizes the CNT surface by forming both carboxylic and SOOH groups. It will be appreciated that other "super-acids" may be used to functionalize the film in different example implementations.

In addition to, or in place of, the PVP overcoat, an overcoat or passivation layer may be applied over the functionalized CNT thin film. Such an overcoat or passivation layer may help protect the film from water in the event that the acid leaches away, help protect people who may come into contact with any acid that has leached away, and/or protect the underlying film (e.g., from burning away, etc.). Such a coating may be a thin film layer of ZnO, zirconium oxide, silicon oxide, silicon nitride, silicon oxynitride, silicon cardbine, etc. Such a coating also may be a polymer-based layer, a resin (such as epoxy), etc. A UV-blocking coating also may be used for an overcoat/passivation layer.

In order to further stabilize the CNT coating, poly(3,4-ethylenedioxythiophene):poly(4-styrenesulfonate) (PEDOT:PSS)-PEG composite thin films are slot coated from aqueous dispersion. Polyethylene glycol (PEG) additive in Baytron P500 helps increase the conductivity of the PEDOT:PSS. In addition, the PEG has numerous ether groups containing oxygen in between the terminal hydroxyl groups. When the PSC, containing free ungrafted PEG additive, is coated onto the CNT functionalized with carbonyl groups, the hydroxyl groups on these free ungrafted PEG molecules react with the carboxylic groups on the CNT walls. This causes the PEG to be grafted onto the $H_2SO_4$ functionalized CNT. PEG-PEDOT:PSS are bonded to the CNT walls through hydrogen bonding of the ether groups of grafted PEG and terminal hydroxyl groups of the free ungrafted PEG. The higher stability stems from a reduced tendency to take up water from the air, which is attributed to a denser packing of the PEDOT:PSS:PEG/CNT composite. The sheet resistance and roughness of the films were measured again after coating with PSC solution. As a control PSC solution was also coated onto bare soda-lime glass substrates to evaluate the actual sheet resistance and roughness of the spin-coated film, and the results of this testing are provided below.

It will be appreciated that an as-deposited film may be placed in a vacuum or oven so as to help dry the coating and/or remove any excess water. Still further, it will be appreciated that the functionalized CNT thin films may be thermally tempered.

Chemical functionalization also may be performed using more permanent or stable dopants. These techniques may be used in place of, or in combination with, the super acid approach described above. For example, chemical functionalization of CNTs by diazonium salts is possible. For example, 4-bromobenzenediazonium tetrafluoroborate (BDF) and/or triethyloxonium hexachloroantimonate (OA) may be used to dope the CNT. BDF tends to extract electrons from the CNT and release nitrogen. The reaction is driven by the formation of a stabilized charge transfer complex and will lead to p-type doping of the CNTs. Also, using OA as a one-electron oxidant leads to a similar doping state. The devices were treated with either a 5.5 mM solution of BDF in water for 10 min or with a 2.7 mM solution of OA in chlorobenzene for 12 hours. After chemical modification, the samples were annealed at 100 degrees C. in air. Both chemical reactions lead to hole injection into the CNTs and preferentially affect defects in the sidewalls of the CNTs. Conditions may be optimized so that the likelihood of introducing additional structural defects is reduced and/or eliminated.

As another example, a polyol method may be used so that a metal salt precursor (e.g., including bromine and/or iodine) is reduced by a polyol, which is a compound containing multiple hydroxyl groups. The polyol used in this synthesis, ethylene glycol, served as both the reducing agent and solvent. 10 mL of ethylene glycol was heated at 150 degrees C. for one hour with stirring (260 rpm). This pre-heating was done in disposable glass vials placed in an oil bath. 40 μL of a 4 mM $CuCl_2 \cdot 2H_2O$/ethylene glycol solution was added, and the solution was allowed to heat for 15 minutes. 1.5 mL 114 mM PVP/ethylene glycol was then added to each vial, followed by 1.5 mL 100 mM $AgNO_3$/ethylene glycol. All reagents were delivered by pipette. The reaction was stopped when the solution became gray and wispy, after approximately one hour. The reaction was stopped by submerging the vials in cold water. The product was washed and mixed into the CNT ink. In this and/or other ways, silver nanowires may be mixed into the ink that is then applied to the substrate. This may be done in place of, or in addition to, forming silver nanowires on the substrate (e.g., prior to, during, or following application of modified or unmodified CNT-inclusive ink)

The salt may be changed to silver bromide, and the same polyol reduction technique as described above may be used. Although the density and statistical nature of the Ag wires formed were the same as silver nitrate, silver bromide may provide lower sheet resistances compared to the salts. UV may be used to photo-induce the reduction of silver and oxidize the Br ions to Br, indicating that the bromine is an active dopant for CNT tubes.

It also has been found that the presence of Li ions in the form of LiPON has the effect of decreasing the sheet resistance of the pure CNT films by at least 50%. The LiPON can be sputtered onto the glass prior to CNT film deposition using, for example, mayer rod techniques. In a parallel effort, the LiPON may be embedded in the glass prior to coating of the CNT ink and then activated by heat treatment.

It will be appreciated that the chemical functionalization approaches described above using super acids and salts will result in p-type doping. As alluded to above, however, CNTs may also accommodate n-type dopants. N-type doping may be accomplished using the same techniques as those described above, provided that different dopants are used. For instance, dopants such as, for example, Au, Al, Ti, and/or other metals may be used in connection with the above-described techniques. Organic chemicals including, for example, polyethylene imine (PEI) also may be used. PEI in particular may be dissolved in methanol. The CNT coating may be dipped into it to dope by physiand chemsorbtion.

A remote low energy oxygen or ozone plasma treatment also may be applied to CNT thin films in place of, or in addition to, the above-described example techniques. This process essentially creates COOH radicals. In certain example embodiments, a simple corona discharge (either positive or negative or pulsed) is used to breakdown air to produce ozone in a close area under which the film is exposed to the ozone. The tip of the corona discharge is brought over the coating at a distance from 5-10 cm. The film is then exposed to the ozone. The time of exposure can be varied from 1 min. to 10 min. A multi-rod system with tips that develop the corona as the glass travels below discharge may be used to accomplish this process. Other ozonators also may be used in different embodiments of this invention. This discharge of ozone proximate to the glass helps to functionalize the deposited CNT film by oxidizing the carbon, thereby producing functional moieties on the surface of the tubes that help improve the conductivity of the tubes, effectively doping the film p-type.

Further detail regarding the results of the example super acid approach described above will now be provided in terms of film characterization and CNT film/glass adhesion.

The level of defects in the tubes may be quantified using Raman spectroscopy. For example, FIG. 1a shows the raw Raman spectrum of a typical pristine undoped film. It exhibits the key features of the CNT's breathing modes (~240 cm$^{-1}$). The singlet and doublet RBM peaks observed confirm the presence of both SWNT and DWNT respectively. Raman shift $\omega_{RBM}$ is related to diameter via the relation $\omega_{RBM}$ (cm-1)≈A/$d_t$+B where A=234 and B~10 which yields a value of 1.01 nm. For the DWNT, using the $\Delta\omega_{RBM}$, it can be deduced that the distance between the inner and outer tubes is ~0.32 nm. FIG. 1b shows the G and D peaks, and the ratio of their intensities is associated with the level of perfection of the graphitic lattice. This ratio is typically in the order of 15 and, taken together with the RBM modes, confirms the presence of extremely thin (~1.6 nm) and high electronic quality tubes. The lowest lines correspond to data for the silicon substrate alone, the middle lines correspond to data for single-wall tubes, and the top lines correspond to data for double-wall tubes.

The scanning electron micrograph (SEM) picture in FIG. 2a is that of a typical CNT film on glass. One can deduce quite accurately the diameter and length statistics of such a nano-mesh film. As can be seen, the film is a nano-mesh with the tubes in the plane of the glass substrate. Film morphology can be characterized by the porosity and the average bundle diameter (a bundle being composed of individual tubes). The SEM photomicrograph confirms the Raman data and indicate that the individual DWNT have a diameter of about 1.6 nm and the median bundle diameter about 18 nm. The film morphology is characterized by its porosity (void content which increases with thinner or sparser film) and the average bundle diameter (which tends to be lower with better ink exfoliation and sonication). Modeling performed by the inventor of the instant application has shown that electrical conductivity increases with lower porosity. The porosity can be inferred from the ratio of the film density (extracted from floatation technique) to individual tube density. The porosity is estimated to be on the range of 40-70%. FIG. 2b is a scanning electron micrograph (SEM) picture of a composite PEDOT/PSS embedded into the CNT as the network is approximately one-quarter full, in accordance with an example embodiment. Details of the model are provided below.

Atomic force microscope (AFM) measurements were performed on the three classes of films deposited, namely, undoped, doped and PSC-coated films. The RMS roughness is found to be about ~9 nm for the thin films, decreasing to about 4 nm for the PSC-coated films.

Spectral transmittance Tvis and reflectance Rvis of the film on glass substrates were measured as a function of CNT film thickness ranging from 5 nm to 40 nm. Metallic SWNTs of 1.4-1.6 nm diameter, in particular, appear to be desirable chiralities for general purpose transparent conduction, as their transmittance in the visible spectrum seems to be the highest around 550 nm. The transmittance of the doped $H_2SO_4$ functionalized films is systematically always larger (≤1%) than the same film in the undoped state. The films were also optically characterized using ellipsometry using an effective medium approximation to deduce the fill-factor (or porosity).

The sheet resistances ($R_s$) of the films were measured using four-point probes capable of highly measurement in the 1-100 and 100-1000 ohms/square. As an additional check, contactless electrical sheet resistance measurements were performed using a Nagy. Work function measurements using ultraviolet photoemission spectroscopy show a work-function of about 5 eV for the pristine films, increasing by 0.3 eV for the chemically modified films.

Figure 3B:
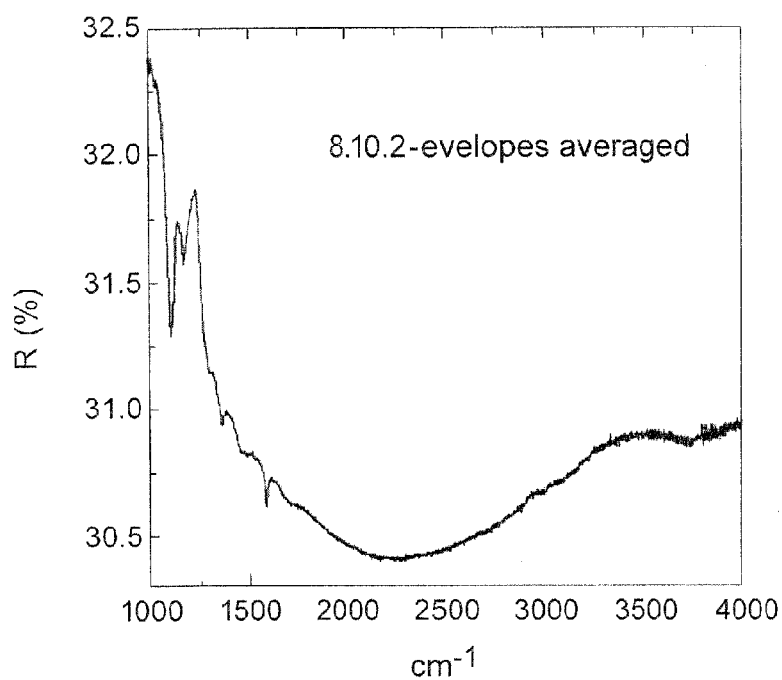
FIG. 3b shows high resolution FTIR spectra data, indicating chemical doping by the $SO_4$ group at around 1050-1100 $cm^{-1}$, in accordance with an example embodiment.

FIG. 3a shows the temperature dependence of the thermoelectric power measured for both as-deposited and $H_2SO_4$ chemically modified samples produced in accordance with an example embodiment. The activation energy of the films can be seen to decrease, providing clear evidence for the shift of the Fermi level and the doping effect of $H_2SO_4$ on the DWNTs. A positive sign of the thermopower indicates that holes are major charge carriers in both pristine and modified CNT films, which contrast with the n-type character of ITO, thus opening new possible applications for these films. FIG. 3b shows high resolution FTIR spectra data, indicating chemical doping by the $SO_4$ group at around 1050-1100 cm-1. The FTIR is operating in reflectance mode.

Figure 3C:
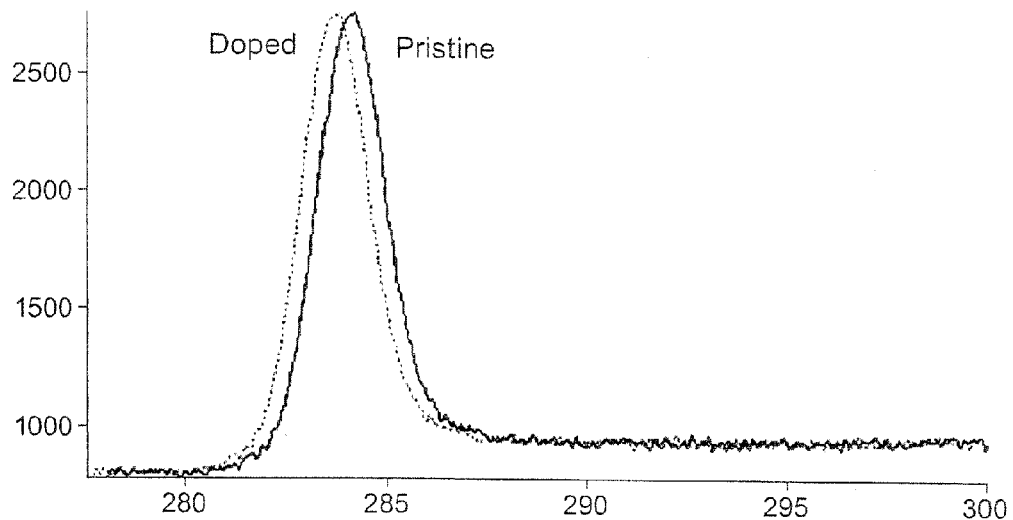
FIG. 3c is an XPS graph showing a shift as between undoped CNT films and CNT films doped in accordance with example embodiments of this invention.

FIG. 3c is an XPS graph showing a shift as between undoped CNT films and CNT films doped in accordance with example embodiments of this invention. As can be seen in FIG. 3c, there is shift to lower energies in the Carbon K-edge by about 0.35 eV. This is evidence the BDF and $H_2SO_4$ are chemically bonding. It will be appreciated that the dopants may be imbued into or provided on the substrate and then coated with the CNT ink in certain example embodiments. For example, glass may be coated with a low density zirconia, and the zirconia may be sulphonated with $H_2SO_4$. The CNT may then be coated on top of the sulphonated $ZrO_2$ in certain example embodiments. One example advantage of the $ZrO_2$ is to anchor the $H_2SO_4$ moieties and still allow the $H_2SO_4$ to chemically dope. The FIG. 3c XPS chart involves $ZrO_2$:$H_2SO_4$ overcoated with CNT. The shift in the Carbon 1s core helps prove that it is possible to stabilize the dopant, even under bombardment of UV. It is noted that the It is believed that the K-edge Shift is related to the SOOH and SOOOH species.

Figure 4:
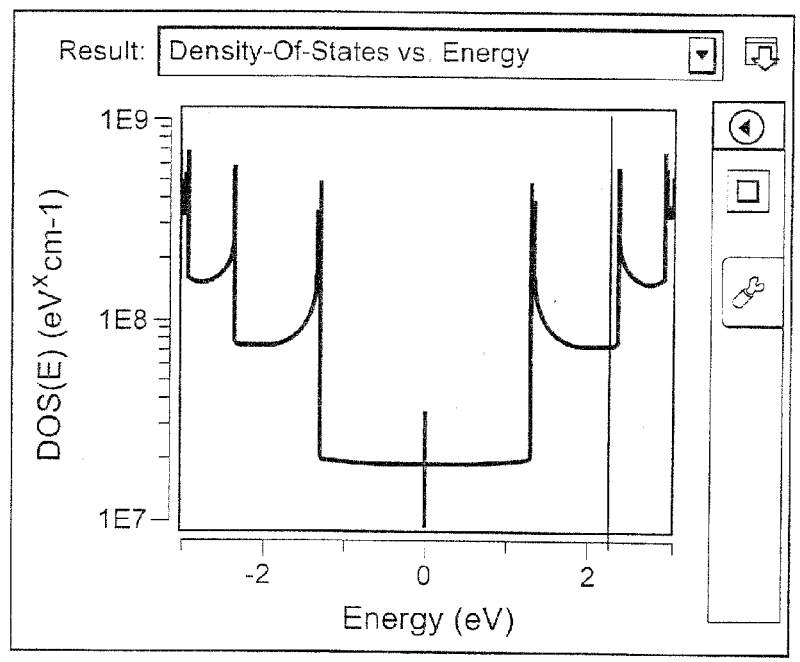
FIG. 4 is a bend diagram showing the density of states (DOS) for a 1.7 nm semiconducting double-wall tube.

In order to measure thin CNT nano-mesh film adhesion to glass, macroscopic and microscopic pull-tests were performed on coated substrates. The epoxy based pull test was performed over a range of samples with film thickness varying from 10 nm to 100 nm composite CNT films. The lower bound for the adhesion metric was found to be greater than $3.4\times10^6$ Pa (500 psi), limited only by the strength of the epoxy bond used or tensile failure in the glass. The microscopic-based adhesion test was performed using an AFM tip to measure the surface energy of adhesion, S, of the films. This technique is highly reproducible and gives a value of S~0.12 and S~0.15 J/m$^2$, which corresponds to an average of $10^7$ Pa. At the other extreme, van der Waal attraction between two ideal surfaces with attractions of approximately 1 J/m$^2$ results in a calculated adhesion strength of about $10^8$ Pa. Even though van der Waal's bonding is usually considered "weak," this type of attraction between two surfaces is large compared to typical adhesion strengths for coatings. By way of comparison, the upper limit for adhesion measurements using a commercially available pull tester is only 5 to $7.0 \times 10^7$ Pa which, is limited by the strength of an epoxy bond. It is interesting to note that these values corroborate well with the calculated values of 0.2 J/m$^2$ based on DFT calculations performed by the inventor of the instant application. To the extent that each inter-CNT contact shares a high tensile strength, the adhesion between a few layers of the nano-mesh CNT film and a substrate like glass will likely fail either at the interface region or in the substrate. FIG. 4 is a bend diagram showing the density of states (DOS) for a 1.7 nm semiconducting double-wall tube.

On a nanometer scale, the film consists of a porous mesh-like structure made up of individual tubes and bundles of very large aspect ratio (L/D≥100) oriented substantially parallel to the substrate. Bundling is most prevalent among the semiconducting tubes, likely initiated by long range unscreened van der Waal forces, and produces a diameter distribution. Unlike the optical conductivity, the dc conductivity is limited by the tunneling of charge carriers from bundle to bundle, such that the overall dc conductivity depends on the number of conductive paths through the film and by the number of inter-bundle junctions on a given path and the average junction resistance. Thus, the $\sigma_{dc}/\sigma_{opt}$ or Tvis/$R_s$ ratio can be optimized by controlling film morphology, as well as enriching the proportion of metallic to semiconducting film. The left shift of the Tvis vs. $R_s$ curve in FIG. 5, which plots Tvis vs. $R_s$ for undoped, doped, and composite doped CNT thin films produced in accordance with an example embodiment, can be explained by the doping of the semiconducting fraction, which improves conductivity of the individual tubes in the network because the morphological structure remains the same. The inter-nanotube junction resistance therefore may be surmised to be either larger or on the same order of magnitude as the individual semiconducting tube resistance.

Because the transparent conductive SWNT films have thicknesses lower than 100 nm, which is considerably shorter than optical wavelengths in the visible and infrared, the sheet resistance of these films can be related to their transmittance:

$$T(\omega) = 1 + Zo/2R * [\sigma_{opt}/\sigma_{dc}(\omega)]^{-2}$$

where $\sigma_{opt}$ is the optical conductivity, which varies as a function of light frequency $\omega$, $\sigma_{dc}$ is the direct current conductivity, and Zo is a constant equal to 300 ohms, the impedance of free space, respectively. After sum-averaging this equation to obtain Tvis, a fit of the measured spectral transmittance data (from 400 nm to 800 nm) vs. R for the transparent undoped, doped, and doped composite conductive films, the metric $\sigma_{dc}/\sigma_{opt}$ may be calculated:

| Description | $\sigma_{dc}/\sigma_{opt}$ | Stability Index |
|---|---|---|
| Undoped DWNT | 0.9 | 0.97 |
| Doped DWNT | 5.5 | 0.93 |
| Doped DWNT-PSC Composite | 10 | 1.02 |

Thus, a conductivity enhancement of about 6 times is observed in the chemically altered compared to the pristine films. The composite film has an even greater enhancement factor, due to the fact that PEDOT:PSS/PEG composite imbues the porous network and provides a parallel path to current flow in terms of holes flux. The composite films also seem to have a higher stability index defined by the ratio of the metric initial verses aged after exposure to humidity and UV light after 10 days. The best result so far observed on film group doped DWNT-PSC composite could be explained by a denser network provided by the composite, thereby reducing (and sometimes even completely preventing) the loss of any adsorbed —SOOH species.

Figure 6:
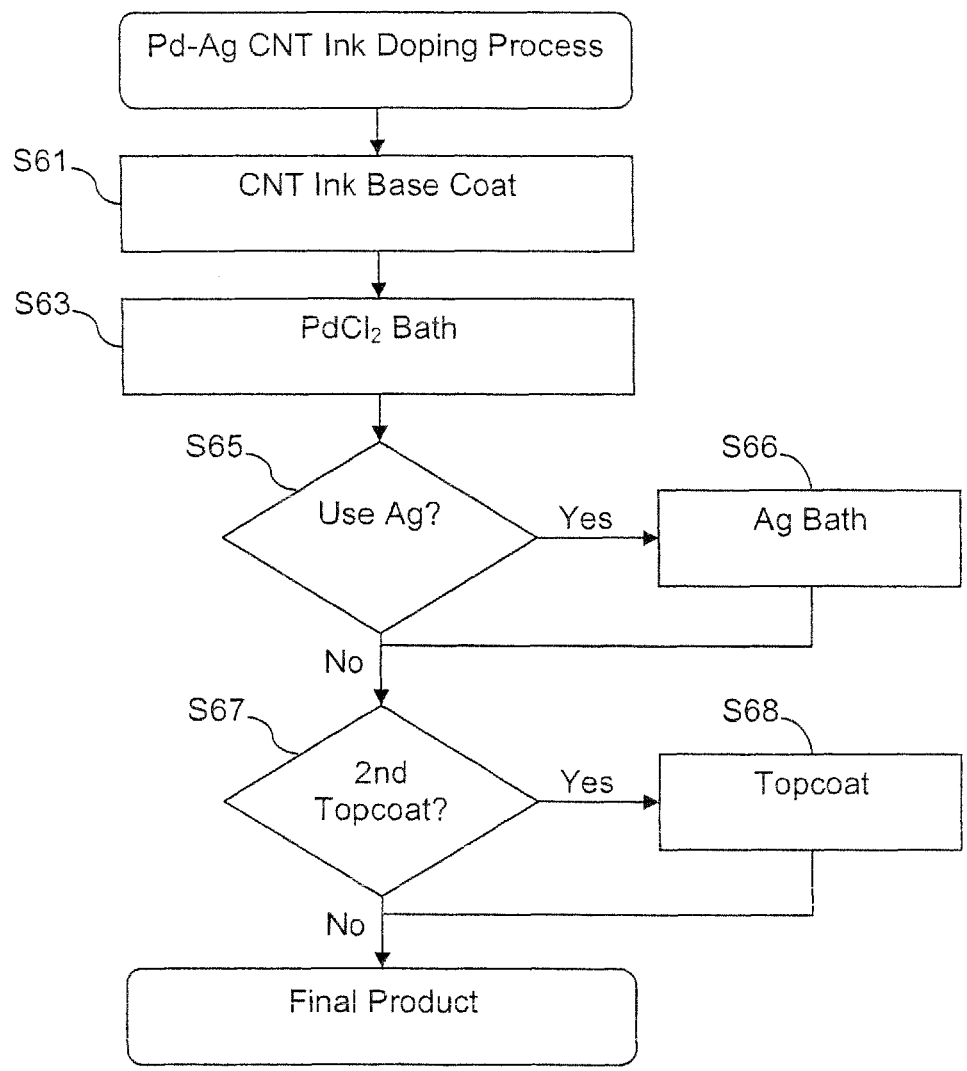
FIG. 6 is a flowchart describing an example process for alloying with palladium and/or silver in accordance with an example embodiment.

In place of, or in addition to, the doping techniques described above, CNT thin films may be alloyed or otherwise metalized, e.g., with palladium and/or silver. FIG. 6 is a flowchart describing an example process for alloying with palladium and/or silver in accordance with an example embodiment. A CNT ink base coat is provided in step S61. This may be accomplished in certain example embodiments by providing a rod size of 5 or 10 in. connection with a slot-die process. The coated article is then placed in a PdCl$_2$ bath in step S63. The PdCl$_2$ is provided at a concentration of 0.01-1.0% by weight, more preferably 0.03-0.5, still more preferably 0.05-0.1% by weight. This concentration may be reached by providing PdCl$_2$ at 5% concentration by weight and then diluting to the selected concentration. This solution is then coated onto already-deposited CNT film. The film has some porosity (typically up to about 65% for the thinnest films). The Pd is effectively provided (electrodelessly) in between the pores, which helps to push more electrons into the nanotubes, in turn, boosting electrical conductivity, after exposure for 5 sec to 1 min., more preferably 10 sec to 30 sec.

It possible to alloy or metalize silver in addition to, or in place of, the palladium. In this regard, if silver alloying or metalizing is desirable in step S65, then the coated article is immersed in a silver bath in step S66. The process involved is similar to the oxidation reaction that takes place in the silver mirror test. In this test, an aldehyde is treated with Tollens' reagent, which is prepared by adding a drop of sodium hydroxide solution into silver nitrate solution to give a precipitate of silver(I) oxide. Just enough dilute ammonia solution is added to re-dissolve the precipitate in aqueous ammonia to produce [Ag(NH$_3$)$_2$]$^+$ complex. This reagent will convert aldehydes to carboxylic acids without attacking carbon-carbon double-bonds. The name "silver mirror test" arises because this reaction will produce a precipitate of silver whose presence can be used to test for the presence of an aldehyde. If the aldehyde cannot form an enolate (e.g. benzaldehyde), addition of a strong base induces the Cannizzaro reaction. This reaction results in disproportionation, producing a mixture of alcohol and carboxylic acid.

Regardless of whether the CNTs are alloyed or metalized with silver in step S66, a topcoat may be provided, e.g., over the CNT-based film with the palladium and/or silver alloyed or metalized CNTs. This topcoat may be another silver or palladium deposition, e.g., in accordance with the above. That is, if a second topcoat is desirable in step S67, it may then be provided in step S68. In one or more steps not shown, an encapsulating overcoat or passivation layer as described above may also be provided. In certain example embodiments, a thin film, polymer, resin, and/or other layer may be applied, e.g., using the techniques described above.

It will be appreciated that the palladium and/or silver alloying techniques and processing conditions given below are provided by way of example. In another example, a starting PdCl$_2$ solution (5% in 10% HCl) was diluted with DI water to a chosen concentration (0.25% in 0.5% HCl or 0.1% in 0.2% HCl). Silver nitrate (0.01 g) was dissolved in DI water (10 mL). 23 mL of 0.1N sodium hydroxide was added to solution dropwise with stirring to form a cloudy brown silver oxide percipitate. To the precipitate solution, 5N ammonia was added dropwise until the solution clears (~0.4 mL), indicating the formation of Tollen's reagent. A reducer, GMPMA2000 from Valspar, was added to solution dropwise (2-10 mL) with stirring until a black dispersion of silver colloid fully formed. Glass with a CNT coating was prepared and measured in the standard fashion was cut down (in one example, to 0.25 m×0.25 m) to reduce solution loss. The glass was dipped into a bath of the $PdCl_2$ solution for a predetermined amount of time (10-30 s, although it is possible submerge for longer periods of time), and then excess solution was blown dry. It is noted that larger samples may be rinsed. The glass was then dipped into the silvering solution for no more than 10 s, after which it was blown dry. The backs of the samples were cleaned with nitric acid to remove any residue, and then the entire sample was rinsed with NPA and blown dry to remove residue streaks on the sample front. It will be appreciated that this process may be run on a wet mirror line to reach high production levels. Thus, one illustrative advantage of certain example embodiments is that existing equipment, e.g., a mirror line, may be used to create nanowires and/or metalize the CNTs. In such example implementations, the CNT deposition may be performed using a vertical slot, and a mirror line for alloying. In such cases, instead of making a mirror coating, the reaction may be quenched to deposit only Pd and Ag wires.

FIG. 7 is a chart demonstrating pre- and post-alloying visible transmission and sheet resistances for a variety of samples produced in accordance with an example embodiment. As can be seen, sheet resistance (provided in ohms/square) drops dramatically, while visible transmission remains relatively unchanged. This indicates a marked improvement in the $\sigma_{dc}/\sigma_{opt}$ ratio can be achieved using the example alloying techniques described herein.

As alluded to above, junctions formed between metallic and semiconducting tubes (or bundles) are intrinsically electrically blocking contacts and, on average, limit electrical current flow. One way to circumvent this issue is to provide a CNT ink that is entirely composed of metallic nanotubes, wherein the chirality is controlled so that it is metallic or semi-metallic. Unfortunately, it is not presently possible to provide such an ink at an industrial scale.

Using commercially available ink from Unidym, the inventor of the instant application has determined that it is possible to mitigate these and/or other issues by synthesizing solution-deposited composite films of silver nanowires and carbon nanotubes. The silver nanowires provide the long-distance charge transport and reduce the number of resistive carbon nanotube junctions in a given current path. Meanwhile, the smaller carbon nanotube bundles provide charge collection in the porous areas of silver nanowire meshes and transport charge to the silver nanowires. Films show comparable sheet resistance and transparencies to meshes of pure silver nanowires. Testing also shows that the silver is protected from environmental degradation by the CNT mesh.

More particularly, Ag nanowires were synthesized by the reduction of Ag nitrate in the presence of poly(vinyl pyrrolidone) (PVP) in ethylene glycol. The resulting Ag nanowires were 2-5 microns long and had a diameter of 17-80 nm. To fabricate transparent electrodes using nanowire suspensions, a volume of the nanowire suspension was dropped on a glass substrate with 100 nm thick pre-patterned Ag frit contact pads, and it was allowed to dry in air for 10 min while agitated on a shaker. The resulting films were random meshes of Ag nanowires without significant bundling of wires that were substantially uniform over the area of the substrate.

A series of high resolution TEM as well as SEM photomicrographs have been taken to probe the meshed network of CNT and silver nanotubes. Atomic force microscope (AFM) and STM measurements also have been taken to investigate the resistive losses in sparse films of carbon nanotube bundles. An AFM lithography technique used by the assignee of the instant invention allows the current in a device to be restricted to a single bundle or single junction, thus enabling the EFM (electron field mapping) to provide a map of the potential versus distance along the current path. This allows the measurement of resistance drops that occur along nanotube bundles and at bundle junctions. Preliminary data has shown that bundle resistances of approximately 5-9 k$\Omega$/$\mu$m and junction resistances of 20-40 k$\Omega$/$\mu$m are possible. These initial numbers suggest that resistances of bundle junctions are less than resistances of individual tube junctions found in the literature (~1 M$\Omega$/$\mu$m).

Transparent conductive oxide (TCO) films on glass substrates are used in various types of touch panels including analog resistive, projected capacitive, and surface capacitive touch panels. ITO currently is the workhorse coating for most of these applications, whether it deposited on PET, polycarbonate, or thin glass substrates. Unfortunately, cost and difficulty of wet etch processing (especially in applications where the TCO needs to be patterned as in projected capacitive applications) limits the role of ITO. An opportunity exists for CNT-based coatings to supplement or completely replace ITO, provided Tvis is above 86% at sheet resistance is about 120 ohms/square or lower. CNT-based coatings may be particularly advantageous on curved substrates, where a slot coater can transfer the coating that can then be laser scribed.

The assignee of the instant application has developed a novel fully integrated capacitive-based sensor with embedded electronics that can fingerprint localized touch. See, for example, application Ser. No. 12/318,912, the entire contents of which are hereby incorporated herein by reference. Two sets of orthogonal electrode patterns are created within the doped CNT coating on 0.7 mm glass and PET substrates using laser ablation. The substrates are then laminated to form an array of fringe effect capacitors formed by the patterned CNT electrodes. A smart card thin flexible substrate contains the ancillary surface mounted electronics components.

Figure 8:
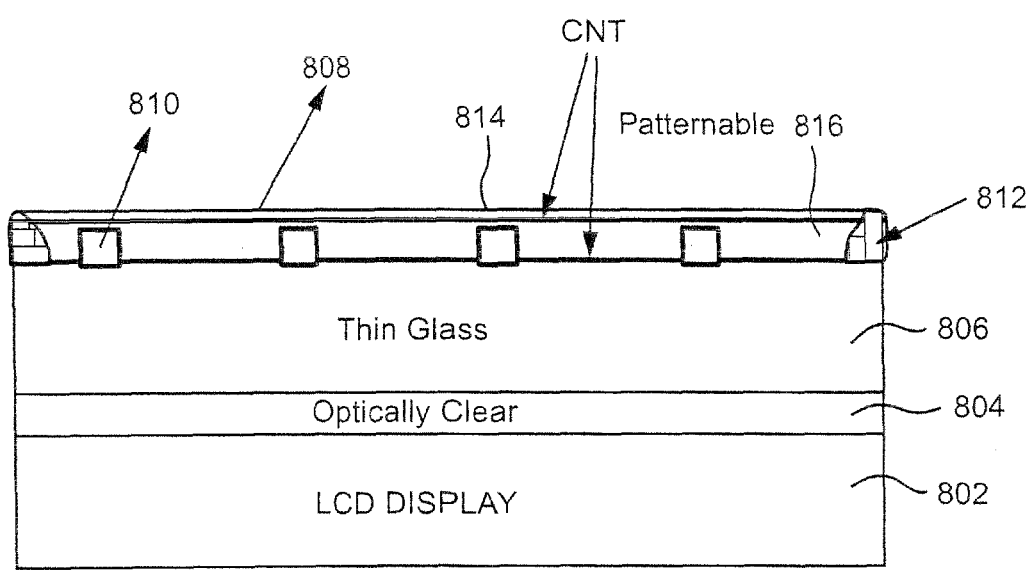
FIG. 8 is a cross-sectional schematic view of a touch screen incorporating CNT-based layers according to certain example embodiments.

A touch panel display may be a capacitive or resistive touch panel display including ITO or other conductive layers. See, for example, U.S. Pat. Nos. 7,436,393; 7,372,510; 7,215,331; 6,204,897; 6,177,918; and 5,650,597, and application Ser. No. 12/292,406, now U.S. Pat. No. 8,080,141 the disclosures of which are hereby incorporated herein by reference. The ITO and/or other conductive layers may be replaced in such touch panels may be replaced with CNT-based layers. For example, FIG. 8 is a cross-sectional schematic view of a touch screen incorporating CNT-based layers according to certain example embodiments. FIG. 8 includes an underlying display 802, which may, in certain example embodiments, be an LCD, plasma, or other flat panel display. An optically clear adhesive 804 couples the display 802 to a thin glass sheet 806. A deformable PET foil 808 is provided as the top-most layer in the FIG. 8 example embodiment. The PET foil 808 is spaced apart from the upper surface of the thin glass substrate 806 by virtue of a plurality of pillar spacers 810 and edge seals 812. First and second CNT-based layers 814 and 816 may be provided on the surface of the PET foil 808 closer to the display 802 and to the thin glass substrate 806 on the surface facing the PET foil 808, respectively. One or both CNT-based layers 814 and 816 may be patterned, e.g., by ion beam and/or laser etching.

A sheet resistance of less than about 500 ohms/square for the CNT-based layers is acceptable in embodiments similar to those shown in FIG. 8, and a sheet resistance of less than about 300 ohms/square is advantageous for the CNT-based layers.

It will be appreciated that the ITO typically found in display 802 itself may be replaced with one or more CNT-based layers. For example, when display 802 is an LCD display, CNT-based layers may be provided as a common electrode on the color filter substrate and/or as patterned electrodes on the so-called TFT substrate. Of course, CNT-based layers, doped or undoped, also may be used in connection with the design and fabrication of the individual TFTs. Similar arrangements also may be provided in connection with plasma and/or other flat panel displays.

In yet another variant of this technology the CNT electrodes is be printed on surface 4 of windshield (or between surfaces 2 and 3 respectively). The driver electronics can be either capacitively coupled or in direct contact via pins producing a fractal-based electric field sensing system based on CNT coatings via a combination of excitation, return, and shield electrodes. See, for example, application Ser. No. 12/453,755, now U.S. Pat. No. 8,009,053 the entire contents of which are hereby incorporated herein by reference. This system is capable of achieving sensing areas of at 1500 mm$^2$ and conforms to the windshield surface. The system comprises multiple layers of distributed array capacitors stacked on top of each other and electrically isolated and shielded from each other. In this compact design, a flip chip light sensor also may be integrated to monitor both the visible and IR spectrum for both night vision as well as solar radiation load into the vehicle. See, for example, U.S. Pat. No. 7,504,957, the entire contents of which are hereby incorporated herein by reference. The sensor may consume low power (mW) and have high resolution (millimeter), low latency (millisecond), high update rate (1 kHz), and high immunity to noise (>70 dB).

The above-described light sensors and rain sensors can be used in refrigerator/freezer door applications, as well. A capacitive sensor may be provided, which may include at least one CNT-based layer. When moisture or condensation is detected, an active solution may selectively heat a CNT-based line or layer so as to reduce condensation. See, for example, application Ser. No. 12/149,640, now U.S. Pat. No. 7,964,821 the entire contents of which are hereby incorporated herein by reference. In such active anticondensation applications, a CNT-based line or layer may be used to replace ITO or other TCO. This may be particularly advantageous, in that CNT-based lines or layers are better able to withstand current, e.g., because they do not degrade or oxidize as rapidly as some TCOs (including, for example, ITO). Example active solutions are disclosed in, for example, application Ser. No. 12/458,790, U.S. Pat. Nos. 7,246,470; 6,268,594; 6,144,017; and 5,852,284, and U.S. Publication No. 2006/0059861, the entire contents of each of which are hereby incorporated herein by reference.

Defogging and deicing example embodiments were fabricated with a CNT-inclusive film having a sheet resistance of 10 ohms/square. This example film has advantages over both silver coatings and ITO. For instance, there was no sign of corrosion after almost 1000 cycles of defog. In comparison, at this number of cycles, the ITO releases oxygen and starts to show color change, and pure silver thin films start to corrode. The high electric field at the tips seems to also behave in a "crisper" or cleaner manner. As much as 10 KW per meter square was applied on a 12×12 sample and, at this level, performance was very good.

Figure 9:
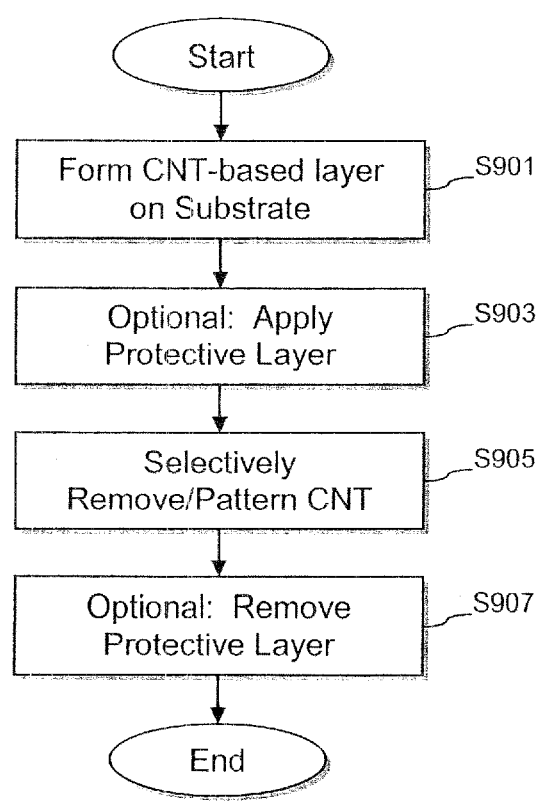
FIG. 9 is a flowchart illustrating an example technique for forming a conductive data/bus line in accordance with certain example embodiments.

CNT-based layers also may be used to create conductive data/bus lines, bus bars, antennas, and/or the like. Such structures may be formed on/applied to glass substrates, silicon wafers, etc. Similarly, CNT-based layers may be used to form p-n junctions, rectifiers, transistors, electronics on glass including, for example, solid state valves, and/or the like. FIG. 9 is a flowchart illustrating an example technique for forming a conductive data/bus line in accordance with certain example embodiments. In step S901, a CNT-based layer is formed on an appropriate substrate. In an optional step, step S903, a protective layer may be provided over the CNT-based layer. In step S905, the CNT-based layer is selectively removed or patterned. This removal or patterning may be accomplished by laser etching. In such cases, the need for a protective layer may be reduced, provided that the resolution of the laser is fine enough. Alternatively or in addition, etching may be performed via exposure to an ion beam/plasma treatment. Also, H* may be used, e.g., in connection with a hot filament. When an ion beam/plasma treatment is used for etching, a protective layer may be desirable. For example, a photoresist material may be used to protect the CNT areas of interest. Such a photoresist may be applied, e.g., by spin coating or the like in step S903. In such cases, in another optional step, S907, the optional protective layer is removed. Exposure to UV radiation may be used with appropriate photoresists, for example.

CNT-based layers also may be used in photovoltaic devices, e.g., in semiconductor and/or absorber layers, provided the sheet resistance thereof can be provided at an appropriate level. CNT-based layers may be particularly advantageous in such cases, as they can be doped p-type or n-type, as explained above.

As indicated above, CNT-based coatings also may be used in connection with OLED displays. A typical OLED comprises two organic layers—namely, electron and hole transport layers—that are embedded between two electrodes. The top electrode typically is a metallic mirror with high reflectivity. The bottom electrode typically is a transparent conductive layer supported by a glass substrate. The top electrode generally is the cathode, and the bottom electrode generally is the anode. ITO often is used for the anode. When a voltage is applied to the electrodes, the charges start moving in the device under the influence of the electric field. Electrons leave the cathode, and holes move from the anode in opposite direction. The recombination of these charges leads to the creation of photons with frequencies given by the energy gap (E=hv) between the LUMO and HOMO levels of the emitting molecules, meaning that the electrical power applied to the electrodes is transformed into light. Different materials and/or dopants may be used to generate different colors, with the colors being combinable to achieve yet additional colors. CNT-based films may be used to replace the ITO that typically is present in the anode. CNT-based films also may be used in connection with the hold-transporting layer.

Figure 10:
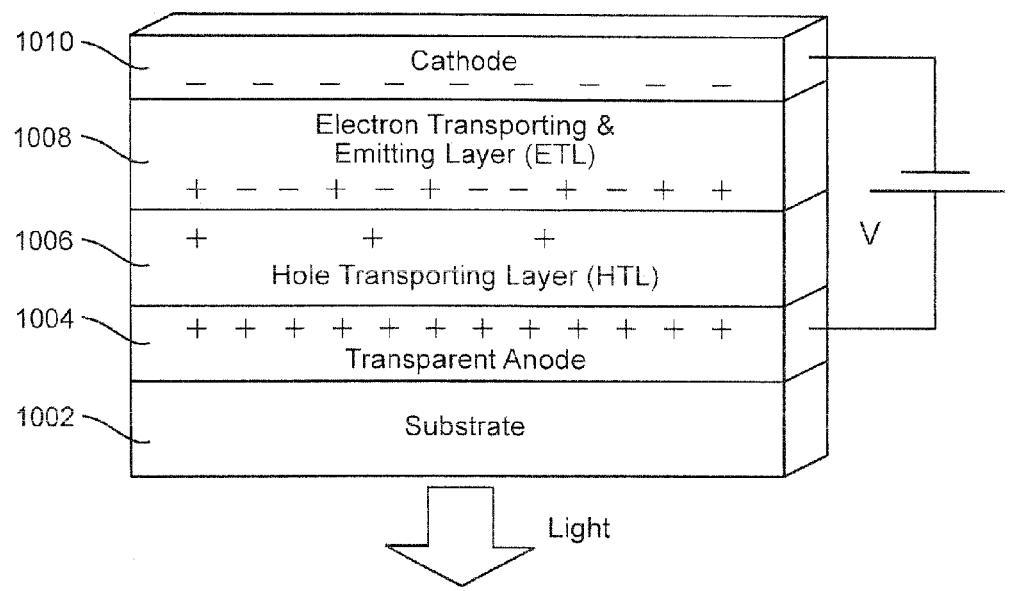
FIG. 10 is an example cross-sectional view of an OLED incorporating a CNT-based coating in accordance with an example embodiment.

FIG. 10 is an example cross-sectional view of an OLED incorporating a CNT-based coating in accordance with an example embodiment. The glass substrate 1002 may support a transparent anode layer 1004, which may be a CNT-based layer. The hole transmitting layer 1006 also may be a CNT-based layer, provided that it is doped with the proper dopants. Conventional electron transporting and emitting and cathode layers 1008 and 1010 also may be provided. For additional information concerning OLED device, see, for example, U.S. Pat. Nos. 7,663,311; 7,663,312; 7,662,663; 7,659,661; 7,629, 741; and 7,601,436, the entire contents of each of which are hereby incorporated herein by reference.

In certain example embodiments, CNT-based films produced in accordance with the above methods may be used in connection with low-emissivity applications. For instance, CNT-based films may be provided in monolithic and insulating glass (IG) windows. These CNT-based films are heat treatable such that the substrates that support them may be annealed or thermally tempered with the films thereon. Because CNT-based films are survivable, they may be provided on any surface of such windows. Of course, it will be appreciated that encapsulating them with an overcoat or passivation layer also may help ensure survivability and exposure to the environment.

Another example electronic device that may make use of one or more CNT-based layers is a solar photovoltaic device. Such example devices may include front electrodes or back electrodes. In such devices, the CNT-based layers may simply replace the ITO typically used therein. Photovoltaic devices are disclosed in, for example, U.S. Pat. Nos. 6,784,361, 6,288,325, 6,613,603 and 6,123,824; U.S. Publication Nos. 2008/0169021; 2009/0032098; 2008/0308147; and 2009/0020157; and application Ser. Nos. 12/285,374, 12/285,890, now U.S. Pat. No. 8,022,291 and 12/457,006, now U.S. Pat. No. 8,445,373 the disclosures of which are hereby incorporated herein by reference. A photovoltaic device also is disclosed in "Highly Absorbing, Flexible Solar Cells With Silicon Wire Arrays Created," ScienceDaily, Feb. 17, 2010, the entire contents of which is hereby incorporated herein by reference, and CNT-based layers may be used in such a device.

Figure 11:
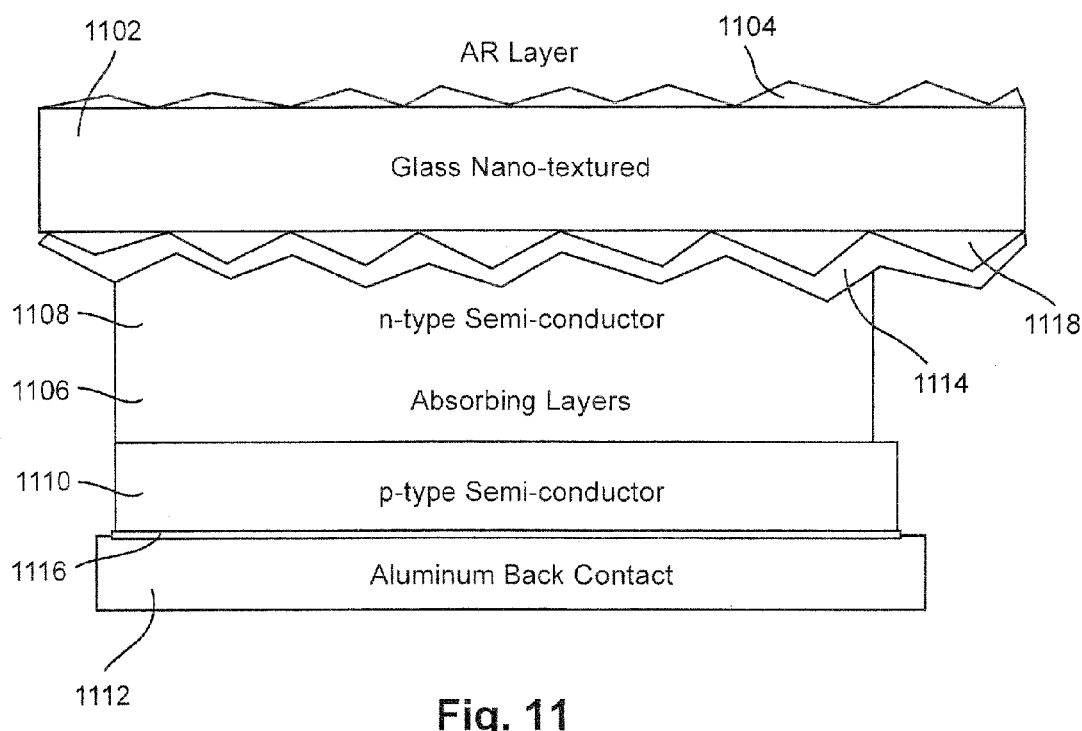
FIG. 11 is a cross-sectional schematic view of a solar photovoltaic device incorporating graphene-based layers according to certain example embodiments.

Alternatively, or in addition, doped CNT-based layers may be included therein so as to match with adjacent semiconductor layers. For instance, FIG. 11 is a cross-sectional schematic view of a solar photovoltaic device incorporating CNT-based layers according to certain example embodiments. In the FIG. 11 example embodiment, a glass substrate 1102 is provided. For example and without limitation, the glass substrate 1102 may be of any of the glasses described in any of U.S. patent application Ser. No. 11/049,292 now U.S. Pat. No. 7,700,869 and/or Ser. No. 11/122,218, now U.S. Pat. No. 7,700,870 the disclosures of which are hereby incorporated herein by reference. The glass substrate optionally may be nano-textured, e.g. to increase the efficiency of the solar cell. An anti-reflective (AR) coating 1104 may be provided on an exterior surface of the glass substrate 1102, e.g., to increase transmission. The anti-reflective coating 1104 may be a single-layer anti-reflective (SLAR) coating (e.g., a silicon oxide anti-reflective coating) or a multi-layer anti-reflective (MLAR) coating. Such AR coatings may be provided using any suitable technique.

One or more absorbing layers 1106 may be provided on the glass substrate 1102 opposite the AR coating 1104, e.g., in the case of a back electrode device such as that shown in the FIG. 11 example embodiment. The absorbing layers 1106 may be sandwiched between first and second semi-conductors. In the FIG. 11 example embodiment, absorbing layers 1106 are sandwiched between n-type semiconductor layer 1108 (closer to the glass substrate 1102) and p-type semiconductor 1110 (farther from the glass substrate 1102). A back contact 1112 (e.g., of aluminum or other suitable material) also may be provided. Rather than providing ITO or other conductive material(s) between the semiconductor 1108 and the glass substrate 1102 and/or between the semiconductor 1110 and the back contact 1112, first and second CNT-based layers 1114 and 1116 may be provided. The CNT-based layers 1114 and 1116 may be doped so as to match the adjacent semiconductor layers 1108 and 1110, respectively. Thus, in the FIG. 11 example embodiment, CNT-based layer 1114 may be doped with n-type dopants and CNT-based layer 1116 may be doped with p-type dopants.

Because it sometimes is difficult to directly texture CNT-based layers, an optional layer 1118 may be provided between the glass substrate 1102 and the first CNT-based layer 1114. However, because CNT-based films are flexible, it generally will conform to the surface on which it is placed. Accordingly, it is possible to texture the optional layer 1118 so that the texture of that layer may be "transferred" or otherwise reflected in the generally conformal CNT-based layer 1114. In this regard, the optional textured layer 1118 may comprise zinc-doped tin oxide (ZTO). It is noted that one or both of semiconductors 1108 and 1110 may be replaced with polymeric conductive materials in certain example embodiments.

Because CNT is highly transparent in the near and mid-IR ranges implies that the most penetrating long wavelength radiation may penetrate and generate carriers deep into the i-layer of both single and tandem junction solar cells. This implies that the need to texture back contacts may not be needed with CNT-based layers, as the efficiency will already be increased by as much as several percentage points.

Screen-printing, evaporation, and sintering technologies and $CdCl_2$ treatment at high temperatures are currently used in CdS/CdTe solar cell heterojunctions. These cells have high fill factors (FF>0.8). However, series resistance Rs is an efficiency limiting artifact. In Rs, there is a distributed part from sheet resistance of the CdS layer and a discrete component associated with the CdTe and graphite based contact on top of it. The use of one or more CNT-based layers may help reduce both contributions to Rs, while preserving good heterojunction properties. By including CNT-based layers in such a solar structure for both front and back contact arrangements, a substantial efficiency boost may be achieved.

It will be appreciated that certain example embodiments may involve single-junction solar cells, whereas certain example embodiments may involve tandem solar cells. Certain example embodiments may be CdS, CdTe, CIS/CIGS, a-Si, and/or other types of solar cells.

Certain example embodiments that incorporate doped CNT with Pd and Silver nanowires are able to reach a sheet resistance of 10 ohms/square, on average, with a variance of about 30%. This example coating has immediate potential applications, in for example, solar application (e.g., as a TCC). Surface roughness RMS is about 10 nm but, as indicated elsewhere, the coating may be planarized in any number of ways. Another potential application for this low sheet resistance coating involves super capacitors, e.g., for charge storage. Of course, because the ink may be printed on a wide variety of substrates (e.g., glass, plastics, polymers, silicon wafers, etc.) that may be flat or curved, may different applications also are possible. Indeed, a CNT-based coating may be used as a potential antibacterial coating, especially when disposed in connection with a ZnO layer (or ZnO doping of the ink or substrate). Such potential antibacterial behavior may be advantageous in connection with the refrigerator/freezer door and/or other applications described herein.

As indicated elsewhere, CNT-based coatings are suitable to coat curved surfaces such as, for example, vehicle windshields. The material tends not to thin out in the region where the bend is the greatest. In addition, a pattern may be screen printed from ink, e.g., to replace silver frits. One example where this is possible is for antenna bus bars, defogging/deicing applications, and/or the like.

Certain example embodiments also may be used in connection with electrochromic applications. See, for example, U.S. Pat. Nos. 7,547,658; 7,545,551; 7,525,714; 7,511,872; 7,450,294; 7,411,716; 7,375,871; and 7,190,506, as well as Application Ser. No. 61/237,580, the entire contents of each of which are hereby incorporated herein by reference. CNT-based films may replace ITO, as ITO tends to degrade over time and/or otherwise not perform as well as CNT-based films may.

Details regarding the model will now be provided. The model relies on the inventor's recognition that the $\sigma_{dc}/\sigma_{opt}$ ratio can be optimized by understanding and controlling film morphology. More particularly, in view of the above, it will be appreciated that the performance of the CNT-based coating relates' to the network, with the network relating to the mean size of the bundles <D>, mean length of bundles <L>, fill-factor ϕ, interconnect density ni, and quality of individual nanotube, G/D ratio, and length of NT. Given these recognitions, the inventor of the instant application derived a phenomenological model that described current results and enables predictions to be made on the network by studying experimental data. It is assumed that the thickness is such that the system is above the percolation threshold in all studied films.

A characteristic length scale or gauge is defined over which the electrical properties are probed. The scale Lc can then be viewed as the average distance between junction. If probed at length scale Lp<Lc, the individual single or bundle NT conductivities dominate the network electrical properties. At the other extreme of Lp>Lc, the length scale spans several junctions. The higher the junction density, the more parallel paths options exist, thus attenuating the limiting factor that is the mean junction resistance accordingly the electrical characteristics. However, this simple picture is valid if and only if the electrical conductivity of the tubes is identical. Thus, film conductivity is modulated by the individual tube conductivity $\sigma_{NT}$ which depends on tube chirality, graphitization, dopant level, and length of tube.

It is then possible to write $\sigma_f = f(\sigma_{NT})^* n_j$ as the general equation on large scale and over scale of L<<Lp $\sigma \rightarrow \sigma_{NT}$.

It is then possible to write $n_j = n_b^* <c>$ where $n_b$ is the density of NT bundles, which is given by:

$$N_b = 4FF/(\pi <d^2>^* <L>)$$

where L is mean bundle or tube length typically a couple of microns, <d$^2$> is the mean square diameter of the tube bundles, which can be between 2 to 20 nm depending on the degree of tube exfoliation. FF is the film fill-factor, which is equal to $\rho_f/\rho_{NT}$ and can be estimated by either the flotation technique or by absorption coefficient α of the film.

<c> is the mean half-number of junctions formed per tube and may be estimated by the using the following assumptions and reasoning similar to Onsager to deduce (c).

Mean field approximation where the number density of the nanotube is average number density.

Mean bundle D/L<<1.

Contacts are uncorrelated (totally random).

Consider an assembly of (average number density <ρ>) randomly oriented long rods or strings with large aspect ratio, given a test particle P and a neighbor N, and with their centers joined by a vector r. In free space, alone N could adopt any orientation. However, in the presence of particle P, a fraction, $f_{ex}(r_b)$, of the possible orientations are possible. This excluded fraction is also the probability that N, with its center fixed at $r_b$, will contact P when given a random orientation. Under assumption, we can then write (1):

$$<c> = \tfrac{1}{2} f(r,p) \rho_n dr = \tfrac{1}{2} <\rho_n> \int f(r) dr = \tfrac{1}{2} <\rho_n><V_{ex}> \quad (i)$$

where <$\rho_n$> is the average nanotube (bundle) number density and $V_{ex}$ is the average excluded volume for a distribution of nanotube bundles which under the extra assumption that the tube are soft give. The excluded volume of a soft-core interpenetrable cylinder is:

$$<V_{ex}> = \pi <L><D^2> + 2<L^2><D><\sin\theta> \quad (ii)$$

Given that the average volume of each bundle is:

$$<Vp> = \pi/4\{<D^2><L>\} \quad (iii)$$

from (i) to (iii), an expression for the mean number of contacts per bundle using the fill factor ϕ of a given mesh will be:

$$<c> = \tfrac{1}{2} \phi/V_p V_{ex} \quad (iv)$$

Therefore, the mean junction density $n_j$ is given by:

$$n_j = \tfrac{1}{2}(\phi/V_p)^2 V_{ex} \quad (v)$$

It can be shown from the above equations that can be approximated by:

$$n_j = 4\varphi^2 <D>/(<D^2>)^2 <L^2>/<L>^2 <\sin\theta>$$
$$= 4\varphi^2 <D>/(<D^2>)^2 [\text{var}(L)/<L>^2 + 1] <\sin\theta> \quad (vi)$$

Thus, the conductivity of the film depends on the ratio of the mean square of length of the tubes to the square of the mean. This ratio is basically the variance of the length distribution to square of the mean. The above analysis also emphasizes the importance of taking the bundle length and diameter statistical distribution into account when depositing film networks in potential applications.

In the scale, Lp>>Lc where individual tube or bundle resistance dominates is much less than junction resistance, the film sheet resistance R can be expressed as:

$$R = Rj/(nj^*t) \quad (vii)$$

$\sigma_f = k \, nj/Rj$ which then leads to the expression for sheet resistance of the film of thickness t as a function of the transmission under the regime where film thickness such that αt<1, then T'=T/(1−R)=exp(−αt)=1−αt.

α is proportional by an effective medium approximation to the fill factor ϕ, we then combine all constants into a new constant k". By combining the above equations (under the assumption that the variance in D is very small (such is indeed the case here):

$$R = (\pi D^3/4k\phi^2 t) = \pi D^3 Rj/(4k"\phi)\{\text{var}(L)<L^2>)+1\}<\sin\theta>*1/(1-T')$$

which can be written as T'=1−A/R. The bigger fill factor helps explain the curve as a function of varying the actual density of film. The fill factor ϕ is related to porosity by the factor ϕ=1−P.

Figure 5:
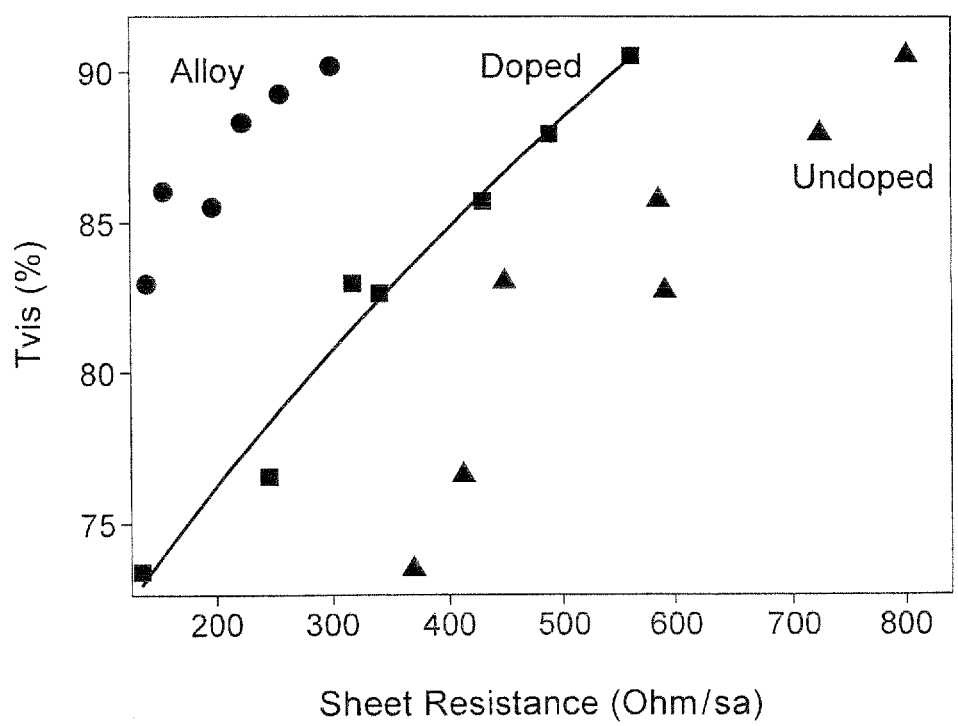
FIG. 5, which plots Tvis vs. Rs for undoped, doped, and composite doped CNT thin films produced in accordance with an example embodiment.

Encoded in A are the factors that control the nature of the curve T vs. R The latter analysis can help us understand how the curve is shifted to the left when doping takes place (e.g., in FIG. 5). All parameters such as L and D are frozen as well, as fill factor. Rj is affected since doping of the semiconducting tubes help decrease the junction resistance. We surmise that at some point the effect of doping will saturate the number density of junction is fixed and the doping efficiency will saturate.

If variance is zero and all tubes were identical with length, the dependence on length would be less noticeable. A is then equal to $\pi D^3 Rj/(4 k"\phi)$. However that is not the case in practice as evidenced by our characterization of network morphology and statistics of the ink individual CNT's.

At this juncture, the length dependence of the NT conductivity should be taken into account. This stems from the very large mean free path of the charge carriers, which is typically around 1 µm for SWCNTs. We surmise from calculations based on density functional analysis that for the DWNT this threshold length is greater than 1 um say (1 to 10 um). Making an individual DWCNT shorter than 1 µm does not increase its overall resistance any further. Therefore, the conductivity sharply drops at short lengths of a few nanometers. DWCNTs exceeding 1 µm have an almost one order of magnitude better resistivity than copper, and a SWCNT of length 100 nm still outpaces the resistivity of W. For DWCNT, the mean free path is calculated to be higher than 1 um, typically at around 5 um. The above-mentioned fact allows a first order approximation of individual tube conductivity to be written as a function of tube length as Taylor expansion:

$$\sigma_{NT} = \sigma_{NTo} + \partial\sigma/\partial L * <L> \quad \text{(viii)}$$

We now take into account the effect of equation (viii) and now R depends (in the limit that variance in L and D are zero) essentially on the individual tube electrical conductance divided by the number of tubes in parallel in the space of $Lp^3$. R can be written as the reciprocal of the length of the tubes. A is now equal to $\pi D^3 Rj/(4 k''\phi) * 1/\sigma_{NT}$. It therefore is shown how the length of the tube and the prime conductivity $\sigma_{NTo}$ of the tube also modulate the conductivity of network especially on the scale L<Lp. Because as mentioned before the doping effect saturate, one may envisage using the fact the films have a certain degree of porosity to nucleate nanometallic particles whose function is to provide a parallel path for carriers to tunnel form tube to tube at a junction. Finally, the effect of the juxtaposition of the tubes is treated, and encoded in the factor <sin θ>. This factor is influenced by the orientation of the tube. To compute the average, the integral of the probability density function is taken in angle orientation $P_\theta * \sin \theta$. Because the output is a cosine function, this factor tends to amplify the effect of length if the tubes have some preferred orientation along the conductive channel. For a uniform angular distribution we would not expect any preference in conduction or anisotropy.

This model indicates that the type of tube (metallic or semiconducting) matters when considering the $\sigma_{dc}/\sigma_{opt}$ ratio. One partial solution therefore is to dope the CNT-based film. The model further indicates that doping eventually stops working because the junction resistance ultimately will dominate. This problem may be overcome by alloying or metallizing, or chemically functionalizing with PEDOT or the like, to short out those junctions. Finally, the model shows that CNT-based films that the following characteristics are desirable: smaller diameter tubes, longer tubes, larger variance in length, and smaller variance in diameter.

Figure 12:
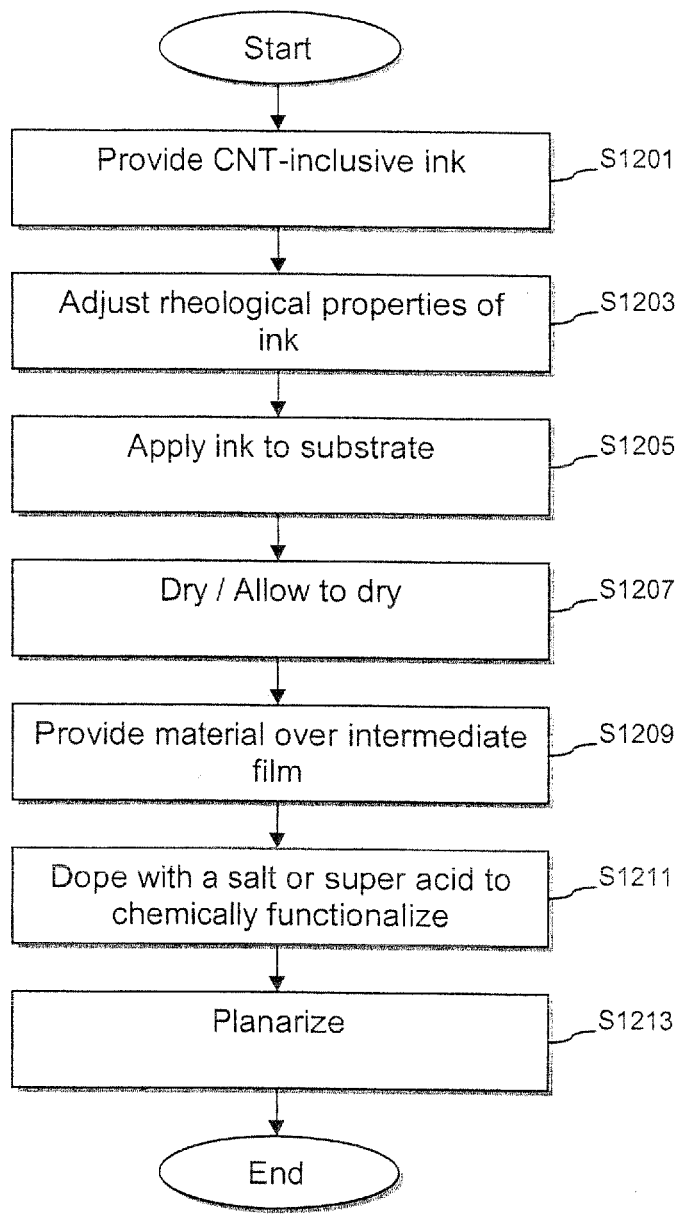
FIG. 12 is a flowchart showing an illustrative technique for applying and chemically functionalizing a CNT-based ink in accordance with an example embodiment.
Figure 13:
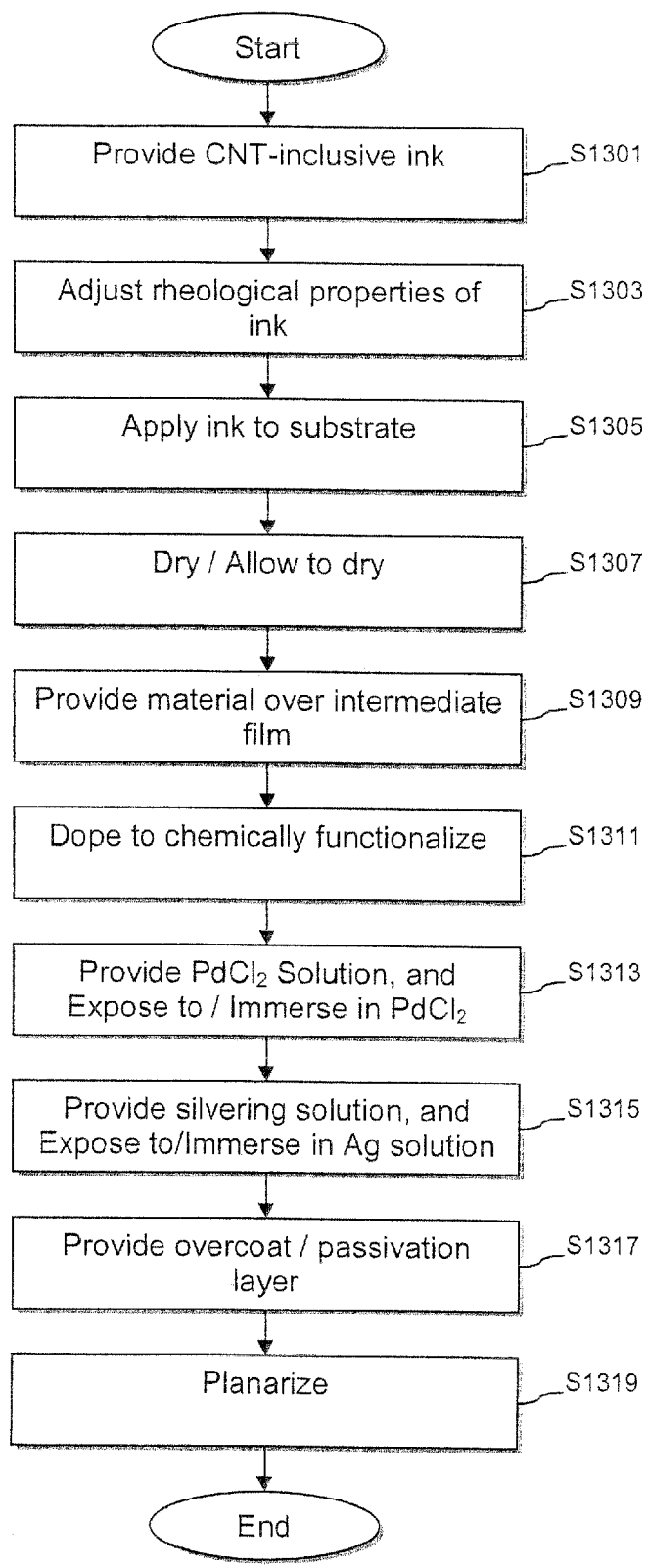
FIG. 13 is a flowchart shown an illustrative technique for applying and alloying and/or chemically functionalizing a CNT-based ink in accordance with an example embodiment.
Figure 14:
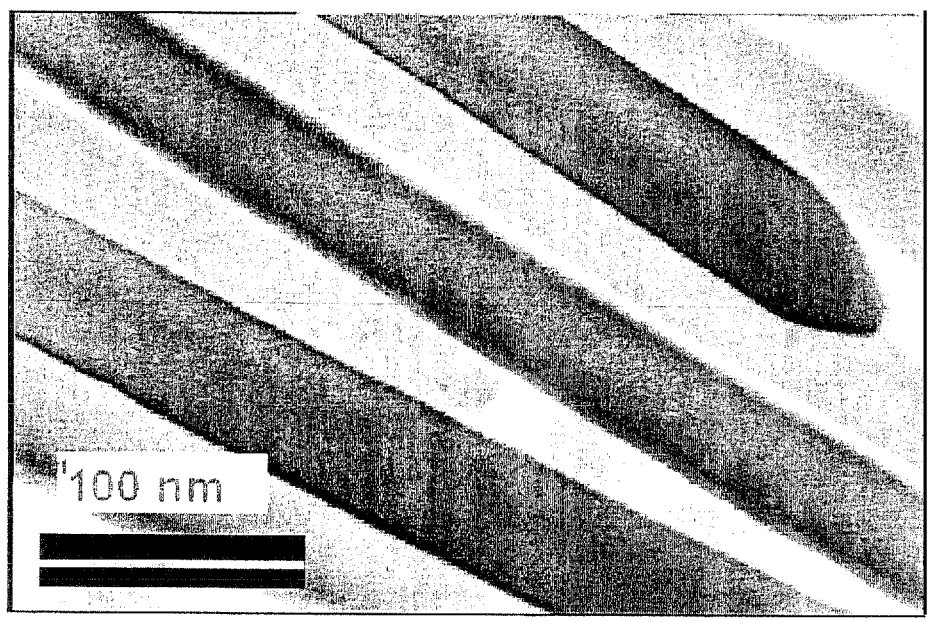
FIG. 14 is a transmission electron microscope (TEM) image of silver nanowires produced in accordance with an example embodiment.

FIGS. 12 and 13 briefly review certain of the example techniques described herein. More particularly, FIG. 12 is a flowchart showing an illustrative technique for applying and chemically functionalizing a CNT-based ink in accordance with an example embodiment. A CNT-inclusive ink is provided in step S1201. The CNT-inclusive ink may comprise or consist essentially of double-wall nanotubes, e.g., with an average diameter of approximately 1.7 nm. In step S1203, rheological properties of the CNT-inclusive ink may be adjusted, e.g., by adding surfactants and/or coating aids to the ink so that any semiconducting CNTs located within the ink are less likely to clump or clot together. In other words, the CNT-inclusive ink may be made more water-like. In certain example embodiments, the ink may be water soluble. Organic and/or inorganic additives and/or solvents may not be necessary in different example embodiments of this invention. It will be appreciated that the ink may be made to simply dissolve in DI water in certain example embodiments, although alcohol may be added in certain example embodiments (e.g., to make the water evaporate faster). Optionally, in a step not shown, Ag nanowires may be incorporated into the ink. The ink having the adjusted rheological properties may be applied to the substrate to form an intermediate coating in step S1205. A slot die apparatus may be used to accomplish this application. The intermediate coating is dried or allowed to dry in step S1207. A material (e.g., an overcoat or passivation material) is provided over the intermediate coating to improve adhesion to the substrate in step S1209. This material may comprise, for example, PVP, PEDOT:PSS, a PEDOT:PSS-PEG composite, zirconia, a silicon inclusive thin film, a polymer or resin, etc. In step S1211, the intermediate coating is doped using a salt and/or super acid so as to chemically functionalize the intermediate coating in forming the CNT-inclusive thin film. In certain example embodiments, the doping may be performed at substantially the same time as the PVP is provided. In certain example embodiments, the super acid is $H_2SO_4$, and in certain example embodiments, the salt is a diazonium salt (e.g., BDF, OA, or the like). The tubes may be doped p-type or n-type. In step S1213, the film may be substantially planarized, e.g., using material provided over the intermediate coating or a separate conductive or non-conductive (but perhaps thin) layer. Optionally, oxygen or ozone may be discharged proximate to the substrate to functionalize the intermediate coating and/or the CNT-inclusive film by oxidizing carbon located therein. Optionally, in one or more steps not shown, silver nanowires may be synthesized by reducing silver nitrate in the presence of ethylene glycol (and/or PVP). In certain example embodiments, the silver nanowires may be 2-5 microns long and 17-80 nm in diameter. A suspension of synthesized silver nanowires may be dropped on the glass substrate prior to application of the CNT-based ink. In this regard, FIG. 14 is a transmission electron microscope (TEM) image of silver nanowires produced in accordance with an example embodiment.

FIG. 13 is a flowchart shown an illustrative technique for applying and alloying and/or chemically functionalizing a CNT-based ink in accordance with an example embodiment. A CNT-inclusive ink is provided in step S1301. The CNT-inclusive ink may comprising or consist essentially of double-wall nanotubes. In step S1303, the adjusting rheological properties of the CNT-inclusive ink may be adjusted, e.g., by adding surfactants to the ink so that any semiconducting CNTs located within the ink are less likely to clump together and/or so that the ink becomes more water-like. The ink is applied to the substrate to form an intermediate coating (e.g., using a slot die apparatus) in step S1305. The intermediate coating is then dried or allowed to dry in step S1307. In step S1309, a material (e.g., PVP) is provided over the intermediate coating to improve adhesion to the substrate. Optionally, in step S1311, the intermediate coating is doped so as to chemically functionalize the intermediate coating in forming the CNT-inclusive thin film. Example doping techniques are described in detail above. A solution of $PdCl_2$ is provided, and the intermediate coating is exposed to the solution of $PdCl_2$ in step S1313. The Pd nucleates at junctions within the intermediate coating, thereby reducing porosity in the intermediate coating in forming the CNT-inclusive thin film. This, in turn, reduces sheet resistance while visible transmission remains relatively unchanged. In step S1315, a silvering solution is provided, and the intermediate coating is exposed to the silvering solution, e.g., to short junctions in the intermediate coating. The intermediate coating may be exposed to the silvering solution after exposing the intermediate coating to the solution of $PdCl_2$. The silvering solution may be prepared by dissolving silver nitrate in deionized water. An overcoat or passivation layer (e.g., comprising PEDOT:PSS, zirconia, a silicon-based thin film, a polymer, and/or a resins) is provided over the intermediate coating following the exposing in step S1317. In step S1319, the CNT-inclusive film may be substantially planarized to reduce surface roughness. This planarizing may be performed via the overcoat or passivation layer, or via deposition of an additional layer.

As used herein, the terms "on," "supported by," and the like should not be interpreted to mean that two elements are directly adjacent to one another unless explicitly stated. In other words, a first layer may be said to be "on" or "supported by" a second layer, even if there are one or more layers therebetween.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. A method of making a coated article comprising a substrate supporting a carbon nanotube (CNT) inclusive thin film, the method comprising:
    providing a CNT-inclusive ink;
    applying the ink to the substrate to form an intermediate coating;
    providing a material over the intermediate coating;
    preparing a solution comprising $PdCl_2$; and
    exposing the intermediate coating to the solution comprising $PdCl_2$ so that Pd nucleates at junctions within the intermediate coating, thereby reducing porosity in the intermediate coating in forming the CNT-inclusive thin film.

2. The method of claim 1, further comprising adjusting rheological properties of the CNT-inclusive ink by adding surfactants to the ink so that any semiconducting CNTs located within the ink are less likely to clump together.

3. The method of claim 2, further comprising using a slot die apparatus to apply the ink having the adjusted rheological properties to the substrate.

4. The method of claim 1, further comprising drying the intermediate coating or allowing the intermediate coating to dry.

5. The method of claim 1, further comprising providing PVP over the intermediate coating.

6. The method of claim 1, further comprising doping the intermediate coating so as to chemically functionalize the intermediate coating in forming the CNT-inclusive thin film.

7. The method of claim 1, wherein reducing porosity in the coating reduces sheet resistance.

8. The method of claim 7, wherein the sheet resistance is reduced while visible transmission remains relatively unchanged.

9. The method of claim 1, further comprising substantially planarizing the CNT-inclusive film to reduce surface roughness.

10. The method of claim 1, further comprising
    providing a silvering solution; and
    exposing the intermediate coating to the silvering solution to short junctions in the intermediate coating.

11. The method of claim 10, wherein exposing of the intermediate coating to the silvering solution is performed after exposing the intermediate coating to the solution comprising $PdCl_2$.

12. The method of claim 1, further comprising
    preparing a silvering solution by dissolving silver nitrate in deionized water; and
    exposing the intermediate coating to the silvering solution to short junctions in the intermediate coating.

13. The method of claim 12, wherein exposing of the intermediate coating to the silvering solution is performed after exposing the intermediate coating to the solution comprising $PdCl_2$.

14. A method of making a coated article comprising a substrate supporting a carbon nanotube (CNT) inclusive thin film, the method comprising:
    providing a CNT-inclusive ink, the CNT-inclusive ink comprising double-wall nanotubes;
    applying the ink to the substrate to form an intermediate coating;
    drying the intermediate coating or allowing the intermediate coating to dry;
    providing an adhesion-promoting layer over the intermediate coating;
    doping the intermediate coating with a salt and/or super acid so as to chemically functionalize the intermediate coating;
    providing a solution comprising Pd;
    exposing the intermediate coating to the solution comprising Pd so that Pd nucleates at junctions within the intermediate coating, thereby reducing porosity in the intermediate coating in forming the CNT-inclusive thin film; and
    applying an overcoat or passivation layer over the intermediate coating following the exposing.

15. The method of claim 14, further comprising substantially planarizing the CNT-inclusive film.

16. The method of claim 14, further comprising
    providing a silvering solution; and
    exposing the intermediate coating to the silvering solution to short junctions in the intermediate coating.

* * * * *